US008916338B2

(12) United States Patent
Quillen et al.

(10) Patent No.: US 8,916,338 B2
(45) Date of Patent: Dec. 23, 2014

(54) PROCESSES AND COMPOSITIONS FOR REMOVING SUBSTANCES FROM SUBSTRATES

(71) Applicant: Eastman Chemical Company, Kingsport, TN (US)

(72) Inventors: Michael Wayne Quillen, Gray, TN (US); Dale Edward O'Dell, Blountville, TN (US); Zachary Philip Lee, Conyers, GA (US); John Cleaon Moore, Camarillo, CA (US); Edward Enns McEntire, Kingsport, TN (US); Spencer Erich Hochstetler, Kingsport, TN (US); Richard Dalton Peters, Westfield, IN (US); Rodney Scott Armentrout, Kingsport, TN (US); Darryl W. Muck, Kingsport, TN (US)

(73) Assignee: Eastman Chemical Company, Kingsport, TN (US)

( * ) Notice: Subject to any disclaimer, the term of this patent is extended or adjusted under 35 U.S.C. 154(b) by 0 days.

(21) Appl. No.: 14/084,027

(22) Filed: Nov. 19, 2013

(65) Prior Publication Data

US 2014/0069458 A1 Mar. 13, 2014

Related U.S. Application Data

(63) Continuation of application No. 12/891,745, filed on Sep. 27, 2010, now Pat. No. 8,614,053, and a continuation-in-part of application No. 12/413,085, filed on Mar. 27, 2009, now Pat. No. 8,444,768, which is a continuation-in-part of application No. 12/715,978, filed on Mar. 2, 2010, now Pat. No. 8,309,502.

(60) Provisional application No. 61/164,195, filed on Mar. 27, 2009.

(51) Int. Cl.
*G06F 7/00* (2006.01)
*H01L 21/00* (2006.01)
*G03F 7/42* (2006.01)

(52) U.S. Cl.
USPC ........... 430/329; 430/311; 430/331; 510/175; 510/176

(58) Field of Classification Search
USPC .................. 430/329, 311, 331; 510/175, 176
See application file for complete search history.

(56) References Cited

U.S. PATENT DOCUMENTS

| | | |
|---|---|---|
| 3,582,401 A | 6/1971 | Berilla et al. |
| 3,734,874 A | 5/1973 | Kibler et al. |
| 3,779,993 A | 12/1973 | Klber et al. |
| 3,828,010 A | 8/1974 | Davis et al. |
| 4,169,068 A | 9/1979 | Harita et al. |
| 4,233,196 A | 11/1980 | Sublett |
| 4,303,454 A | 12/1981 | Petterson et al. |
| 4,744,834 A | 5/1988 | Haq |
| 4,770,713 A | 9/1988 | Ward |
| 4,861,512 A | 8/1989 | Gosselink |
| 4,925,588 A | 5/1990 | Berrod et al. |
| 5,006,598 A | 4/1991 | Adams et al. |
| 5,091,103 A | 2/1992 | Dean et al. |
| 5,142,020 A | 8/1992 | Kud et al. |
| 5,182,043 A | 1/1993 | Morrall et al. |
| 5,218,042 A | 6/1993 | Kuo et al. |
| 5,290,631 A | 3/1994 | Fleury et al. |
| 5,415,807 A | 5/1995 | Gosselink et al. |
| 5,431,847 A | 7/1995 | Winston et al. |
| 5,436,312 A | 7/1995 | Exner et al. |
| 5,496,491 A | 3/1996 | Ward et al. |
| 5,502,118 A | 3/1996 | Macholdt et al. |
| 5,543,488 A | 8/1996 | Miller et al. |
| 5,547,612 A | 8/1996 | Austin et al. |
| 5,552,495 A | 9/1996 | Miller et al. |
| 5,552,511 A | 9/1996 | Miller et al. |
| 5,554,312 A | 9/1996 | Ward |
| 5,571,876 A | 11/1996 | Miller et al. |
| 5,602,089 A | 2/1997 | Pennaz |
| 5,605,764 A | 2/1997 | Miller et al. |
| 5,691,298 A | 11/1997 | Gosselink et al. |
| 5,698,512 A | 12/1997 | Austin et al. |

(Continued)

FOREIGN PATENT DOCUMENTS

| | | |
|---|---|---|
| DE | 19539394 A1 | 4/1996 |
| EP | 0 267 540 B1 | 5/1988 |

(Continued)

OTHER PUBLICATIONS

Fedynyshyn, T. et al; "Changes in Resist Glass Transition Temperatures Due to Exposure"; Advances in Resist Materials and Processing Technology XXIV; Proceedings of SPIE, vol. 6519; pp. 65197-1 through 651917-12 (2007).

D'Amour, J. D. et al; "Modifications to Thermophysical Behavior in Ultrathin Polymer Films"; Advances in Resist Technology and Processing XX; Proceedings of SPIE, vol. 5039, pp. 996-1007 (2003).

SEMI S3-91, Safety Guidelines for Heated Chemical Baths, http://www.etms2.com/safety/heatedchem.htm.

Eastman Publication GN-389C, Sep. 1993.

Eastman Publication CB-41A Dec. 2005.

(Continued)

*Primary Examiner* — Amanda C. Walke
(74) *Attorney, Agent, or Firm* — James K. Leonard

(57) ABSTRACT

Processes associated apparatus and compositions useful for removing organic substances from substrates, for example, electronic device substrates such as microelectronic wafers or flat panel displays, are provided. Processes are presented that apply a minimum volume of a composition as a coating to the inorganic substrate whereby sufficient heat is added and the organic substances are completely removed by rinsing. The compositions and processes may be suitable for removing and, in some instances, completely dissolving photoresists of the positive and negative varieties as well as thermoset polymers from electronic devices.

15 Claims, No Drawings

(56) References Cited

U.S. PATENT DOCUMENTS

| | | | |
|---|---|---|---|
| 5,709,940 A | 1/1998 | George et al. | |
| 5,710,119 A | 1/1998 | Busch et al. | |
| 5,728,671 A | 3/1998 | Rohrbaugh et al. | |
| 5,750,489 A | 5/1998 | Garcia et al. | |
| 5,767,048 A | 6/1998 | Obuse | |
| 5,786,318 A | 7/1998 | Blokzijl et al. | |
| 5,834,412 A | 11/1998 | Rohrbaugh et al. | |
| 5,843,878 A | 12/1998 | Gosselink et al. | |
| 5,863,881 A | 1/1999 | Vlasblom | |
| 5,911,835 A | 6/1999 | Lee et al. | |
| 5,962,388 A | 10/1999 | Sherry et al. | |
| 5,965,319 A | 10/1999 | Kobayashi | |
| 5,985,816 A | 11/1999 | Vlasblom | |
| 5,989,353 A | 11/1999 | Skee et al. | |
| 6,007,749 A | 12/1999 | Wang et al. | |
| 6,060,547 A | 5/2000 | Canter et al. | |
| 6,071,868 A | 6/2000 | Kim et al. | |
| 6,093,689 A | 7/2000 | Vlasblom | |
| 6,127,097 A | 10/2000 | Bantu et al. | |
| 6,146,815 A | 11/2000 | Komatsu et al. | |
| 6,162,890 A | 12/2000 | George et al. | |
| 6,187,729 B1 | 2/2001 | Hayes et al. | |
| 6,211,127 B1 | 4/2001 | Kim et al. | |
| 6,239,094 B1 | 5/2001 | Goderis et al. | |
| 6,240,933 B1 | 6/2001 | Bergman | |
| 6,255,274 B1 | 7/2001 | Becherer et al. | |
| 6,310,263 B1 | 10/2001 | Vlasblom | |
| 6,319,884 B2 | 11/2001 | Leduc et al. | |
| 6,369,016 B1 | 4/2002 | Vlasblom | |
| 6,406,969 B2 | 6/2002 | Kim et al. | |
| 6,440,856 B1 | 8/2002 | Bessho et al. | |
| 6,455,479 B1 | 9/2002 | Sahbari | |
| 6,465,403 B1 | 10/2002 | Skee | |
| 6,514,656 B1 | 2/2003 | Nakamura et al. | |
| 6,551,973 B1 | 4/2003 | Moore | |
| 6,579,466 B1 | 6/2003 | David et al. | |
| 6,599,370 B2 | 7/2003 | Skee | |
| 6,600,142 B2 | 7/2003 | Ryan et al. | |
| 6,635,819 B2 | 10/2003 | Awakura et al. | |
| 6,664,220 B2 * | 12/2003 | Mayhall et al. | 510/218 |
| 6,670,107 B2 | 12/2003 | Lachowski | |
| 6,677,286 B1 | 1/2004 | Rovito et al. | |
| 6,686,325 B2 * | 2/2004 | Hoyt et al. | 510/255 |
| 6,756,183 B2 | 6/2004 | Nagase | |
| 6,815,151 B2 | 11/2004 | Tanabe et al. | |
| 6,821,352 B2 | 11/2004 | Rovito et al. | |
| 6,825,156 B2 | 11/2004 | Lee et al. | |
| 6,833,129 B2 | 12/2004 | Löffler et al. | |
| 6,851,873 B2 | 2/2005 | Muraoka et al. | |
| 6,884,571 B2 | 4/2005 | Uenishi | |
| 6,897,004 B2 | 5/2005 | Uenishi et al. | |
| 6,916,772 B2 | 7/2005 | Zhou et al. | |
| 6,943,142 B2 | 9/2005 | Egbe et al. | |
| 6,949,495 B2 | 9/2005 | Suto et al. | |
| 7,129,199 B2 | 10/2006 | Zhang et al. | |
| 7,183,245 B2 | 2/2007 | Moore | |
| 7,198,681 B2 | 4/2007 | Nguyen et al. | |
| 7,246,678 B2 * | 7/2007 | Wisniewski | 180/282 |
| 7,247,208 B2 | 7/2007 | Hsu | |
| 7,256,165 B2 | 8/2007 | Bertrem et al. | |
| 7,385,751 B2 | 6/2008 | Chen et al. | |
| 7,402,341 B2 | 7/2008 | Halahmi | |
| 7,528,098 B2 | 5/2009 | Lee et al. | |
| 7,543,592 B2 | 6/2009 | Lee | |
| 7,687,447 B2 | 3/2010 | Egbe et al. | |
| 7,700,533 B2 | 4/2010 | Egbe et al. | |
| 2002/0001780 A1 * | 1/2002 | Lachowski | 430/329 |
| 2003/0130146 A1 | 7/2003 | Egbe et al. | |
| 2003/0188823 A1 | 10/2003 | Westbrook et al. | |
| 2003/0199406 A1 | 10/2003 | Anzures et al. | |
| 2003/0215754 A1 | 11/2003 | Lundy et al. | |
| 2004/0065540 A1 * | 4/2004 | Mayer et al. | 204/198 |
| 2004/0081922 A1 | 4/2004 | Ikemoto et al. | |
| 2004/0112405 A1 | 6/2004 | Lee et al. | |
| 2004/0127374 A1 | 7/2004 | Jo et al. | |
| 2004/0137379 A1 | 7/2004 | Ikemoto | |
| 2004/0152608 A1 | 8/2004 | Hsu | |
| 2004/0159335 A1 | 8/2004 | Montierth et al. | |
| 2004/0159654 A1 | 8/2004 | Ryan et al. | |
| 2004/0220065 A1 | 11/2004 | Hsu | |
| 2005/0130862 A1 | 6/2005 | Trouillet-Fonti et al. | |
| 2005/0197265 A1 | 9/2005 | Rath et al. | |
| 2006/0014656 A1 | 1/2006 | Egbe et al. | |
| 2006/0099346 A1 | 5/2006 | Martin et al. | |
| 2006/0166847 A1 | 7/2006 | Walker et al. | |
| 2007/0027052 A1 | 2/2007 | Yokoi et al. | |
| 2007/0037719 A1 | 2/2007 | Satoh | |
| 2007/0078072 A1 | 4/2007 | Yokoi et al. | |
| 2007/0099120 A1 | 5/2007 | Ohnishi | |
| 2007/0111912 A1 | 5/2007 | Phenis et al. | |
| 2007/0144384 A1 | 6/2007 | Inno et al. | |
| 2007/0167343 A1 | 7/2007 | Suzuki et al. | |
| 2007/0224811 A1 | 9/2007 | Wang et al. | |
| 2007/0243773 A1 | 10/2007 | Phenis et al. | |
| 2008/0139436 A1 | 6/2008 | Reid | |
| 2008/0139463 A1 | 6/2008 | Scalfaro et al. | |
| 2008/0145797 A1 | 6/2008 | Verbeke et al. | |
| 2008/0163892 A1 | 7/2008 | Huang et al. | |
| 2008/0173328 A1 | 7/2008 | Nishiwaki | |
| 2008/0223414 A1 | 9/2008 | Schuett | |
| 2008/0230092 A1 | 9/2008 | Ko et al. | |
| 2008/0242102 A1 | 10/2008 | Keating | |
| 2008/0296767 A1 | 12/2008 | Tamura et al. | |
| 2009/0084406 A1 | 4/2009 | Lee et al. | |
| 2009/0120457 A1 | 5/2009 | Naghshineh et al. | |
| 2009/0156452 A1 | 6/2009 | Mui et al. | |
| 2009/0162537 A1 | 6/2009 | Kolics et al. | |
| 2009/0163402 A1 | 6/2009 | George | |
| 2009/0246700 A1 | 10/2009 | Sonokawa | |
| 2009/0247447 A1 | 10/2009 | Tamura et al. | |
| 2010/0016202 A1 | 1/2010 | Mui et al. | |
| 2010/0022426 A1 | 1/2010 | Yokoi et al. | |
| 2010/0055897 A1 | 3/2010 | Chou et al. | |
| 2010/0056409 A1 | 3/2010 | Walker et al. | |
| 2010/0070992 A1 | 3/2010 | Morris et al. | |
| 2010/0116290 A1 | 5/2010 | Zhu et al. | |
| 2010/0120647 A1 | 5/2010 | Zhu et al. | |
| 2010/0180917 A1 | 7/2010 | Tanaka et al. | |
| 2010/0242998 A1 * | 9/2010 | Quillen et al. | 134/19 |
| 2011/0229832 A1 | 9/2011 | Kamimura et al. | |
| 2012/0073607 A1 * | 3/2012 | Quillen et al. | 134/19 |

FOREIGN PATENT DOCUMENTS

| | | |
|---|---|---|
| EP | 0 388 592 | 9/1990 |
| EP | 1 091 254 A2 | 4/2001 |
| EP | 1 860 508 A2 | 11/2007 |
| GB | 573145 A | 11/1945 |
| GB | 1551143 A | 8/1979 |
| JP | 11-181494 | 7/1999 |
| WO | WO 9000579 A1 | 1/1990 |
| WO | WO 03012024 A1 | 2/2003 |
| WO | WO 2010110847 A2 | 9/2010 |

OTHER PUBLICATIONS

Morrison, Robert T. and Boyd, Robert N.; Organic Chemistry, 3d Ed.; Allyn & Bacon, Inc.; Boston, MA; Chapter 16, pp. 518-551 (Dec. 1973).

Co-pending U.S. Appl. No. 61/164,195, filed Mar. 27, 2009; now expired.

Co-pending U.S. Appl. No. 12/715,978, filed Mar. 2, 2010.

Co-pending U.S. Appl. No. 12/413,085, filed Mar. 27, 2009.

Co-pending U.S. Appl. No. 12/891,698, filed Sep. 27, 2010.

Notification of Transmittal of the International Search Report and the Written Opinion of the International Searching Authority, or the Declaration date of mailing Jun. 7, 2010 received in corresponding International Application No. PCT/US2010/000776.

Invitation to Pay Additional Fees and, Where Applicable, Protest Fee date of mailing Jun. 23, 2010 received in corresponding International Application No. PCT/US2010/000770.

(56) References Cited

OTHER PUBLICATIONS

Schumacher, Kevin et al.; "Benefits of Waterless Photo Resist Stripping"; Future Fab International; 1997; pp. 207-209; vol. 1, Issue 4.
Eastman Presentation "New Cleaning Technology for Microelectronic & Semiconductor Manufacturing" dated Feb. 2009.
Notification of Transmittal of the International Search Report and the Written Opinion of the International Searching Authority, or the Declaration date of mailing Nov. 11, 2010 received in corresponding International Application No. PCT/US2010/000770.
USPTO Office Action dated May 31, 2012 for related U.S. Appl. No. 12/891,698, filed Sep. 27, 2010.
International Search Report and Written Opinion mailed Nov. 11, 2010 for corresponding PCT Application PCT/US2010/000770.
USPTO Office Action dated Jun. 17, 2011 for related U.S. Appl. No. 12/413,085, filed Mar. 27, 2009.
Copending U.S. Appl. No. 13/346,87, filed Jan. 10, 2012.
USPTO Notice of Allowance dated Oct. 5, 2011 for related U.S. Appl. No. 12/413,085, filed Mar. 27, 2009.
International Search Report mailed Dec. 23, 2011 for corresponding PCT Application PCT/US2011/051489.
International Search Report and Written Opinion mailed Jul. 26, 2012 for corresponding PCT Application PCT/US2011/051148.
USPTO Notice of Allowance dated May 7, 2012 for related U.S. Appl. No. 13/346,877, filed Jan. 10, 2012.
USPTO Office Action dated May 31, 2012 for related U.S. Appl. No. 12/891,698.
USPTO Notice of Allowance dated Jul. 24, 2012 for related U.S. Appl. No. 12/413,085, filed Mar. 27, 2009.
USPTO Office Action dated Jul. 6, 2012 for related U.S. Appl. No. 13/346,877, filed Jan. 10, 2012.
USPTO Notice of Allowance dated Sep. 18, 2012 for related U.S. Appl. No. 12/715,978.
USPTO Notice of Allowance dated Oct. 3, 2012 for related U.S. Appl. No. 12/413,085.

\* cited by examiner

PROCESSES AND COMPOSITIONS FOR REMOVING SUBSTANCES FROM SUBSTRATES

CROSS-REFERENCE TO RELATED APPLICATIONS

This application is a continuation of U.S. patent application Ser. No. 12/891,745 filed Sep. 27, 2010 which is a Continuation-in-Part of U.S. patent application Ser. No. 12/413,085, filed Mar. 27, 2009, now U.S. Pat. No. 8,444,768; and a Continuation-in-Part of U.S. patent application Ser. No. 12/715,978 filed Mar. 2, 2010, now U.S. Pat. No. 8,309,502, which claims benefit of U.S. Provisional Patent Application No. 61/164,195 filed Mar. 27, 2009, the disclosures of which are incorporated herein by reference in their entirety.

FIELD OF THE DISCLOSURE

The present disclosure relates generally to the removal of organic or inorganic substances from a substrate. In particular, the present disclosure relates to the removal of organic substances from a substrate. More particularly, the present disclosure relates to processes and associated apparatus which can be used with a range of compositions, for the removal of organic substances, for example, both amorphous and thermoset polymers from a substrate, for example, electronic devices including, but not limited to, semiconductor wafers, flat panel displays (FPDs), and other microelectronic substrates.

BACKGROUND

Various polymers may be used in the manufacture of electronic devices, including, for instance, photoresists and organic-based dielectrics. Photoresists, for example, may be used throughout semiconductor device fabrication in photolithographic operations. A photoresist may be exposed to actinic radiation through a photomask. Where a positive-acting resist is used, exposure may cause a chemical reaction within the material resulting in a solubility increase in aqueous alkali, allowing it to be dissolved and rinsed away with developer. Where a negative-acting resist is used, cross-linking of the polymer may occur in the exposed regions while leaving unexposed regions unchanged. The unexposed regions may be subject to dissolution and rinsing by a suitable developer chemistry. Following development, a resist mask may be left behind. The design and geometry of the resist mask may depend upon the positive or negative tone of the resist; positive tone resist may match the design of the photomask, while a negative tone resist may provide a pattern that is opposite the photomask design. The use of photoresists may require several cleaning steps with a final clean of the mask before the next circuit design process step is implemented.

Organic-based dielectrics represent engineering polymers used to offer insulative properties to the microelectronic circuit. Examples of these chemistries include polyimide (PI) and poly-(p-phenylene-2,6-benzobisoxazole) (PBO) as manufactured by Hitachi-DuPont Microsystems. Another exemplary organic-based dielectric for electronic applications is bisbenzocyclobutene (BCB), manufactured by the USA-based, Dow Chemical Company. These polymers may be applied to the substrate in a similar fashion as photoresists using conventional spin, spray, or they may be slit-coated (which can be done, for instance in manufacturing FPDs). For these application reasons, organic-based dielectrics may often be referred to as spin-on dielectrics. Once the polymer is applied, the organic-based dielectrics may undergo a patterning process, but ultimately all of these systems lead to a final-stage cure, which may permanently fix the material in place by undergoing chemical and physical property changes. The final material may, for instance, exhibit both electrical and physical properties desirable for performance of the electric circuit. Once these organic-based dielectrics are fully cured, they are considered to be permanent, whereby, the need for rework would either require the use of aggressive materials such as strong acids or bases that likely would attack the substrate or adjacent metals or more practically, the rework condition would be considered as not commercially viable.

Positive photoresists may be based upon resins of the Novolac or polyhydroxystyrene (Phost) varieties chosen for high-resolution device processing in front-end semiconductor and flat panel display (FPD) manufacturing. Positive-tone systems represent the largest volume portion of photoresists produced globally and there are many suppliers. Exemplary suppliers of these systems for both semiconductor and FPD include, but are not limited to, the USA-based AZ Electronic Materials, the USA-based Rohm and Haas Company, and the Japanese company, Tokyo Ohka Kogyo Co. Ltd. In positive photoresist applications, a substrate may be etched by plasma processes, which may use gases of inert and chemical varieties to, for instance, produce both ionized and reactive species that travel through the mask and etch down into the substrate. During etching, ionized and reactive species may combine with atoms of the substrate, form a by-product, and that by-product is vented away via the reduced pressure of the plasma system. These same gaseous species may also impact the photoresist mask, for instance, by baking it into place and also ejecting carbon-containing by-products into the plasma. Photoresist by-products may mix with other species in the plasma and are continually directed down towards the substrate. These materials may condense to form a residue along the sidewalls of the etched features, producing a condition otherwise referred to as anisotropic etching, whereby species are highly controlled and directed into the substrate with little or no lateral loss. Upon completion, this etch residue may be removed along with the resist mask to prevent potentially deleterious effects on subsequent processes and lead to reduced device performance or device failure. Such residues and their associated resist masks, however, can be difficult to remove, normally involving the use of formulated stripper chemistries.

Negative photoresists may be chosen for more rigorous process conditions whereby more aggressive chemical or thermal exposure processes may be used. These negative photoresists include, but are not limited to, isoprene (rubber), acrylic, and epoxy-based resins. Cyclized isoprene (rubber) photoresists may be chosen for their high chemical resistance. Examples of these photoresists, for instance, may be obtained from Fujifilm Electronic Materials, Ltd. under the trade name SC-RESIST or HNR-RESIST. Negative-tone isoprene resin resists may be used in aluminum processing where a brief chemical etch may be used to remove metal surrounding the masked feature. Negative-tone acrylic photoresists may be chosen for wafer-level-packaging bump formation. Suppliers include, but are not limited to, the USA-based Printed Circuits Division of E. I. duPont de Nemours and Company under the trade name RISTON, and the Japan's JSR Corporation for dry-film and spin-on (wet) negative acrylics, respectively. Dry-film and spin-on acrylics may offer an ability to deposit thick layers from 25 microns (μm) to 120 microns (μm), used to pattern the corresponding solder bumps. Once the pattern is formed, metal deposition may occur by electroplating or screen-printing, a process that may expose the resist to heated acid or baking in excess of 250° C., respectively. Another exemplary negative resist is an epoxy system under the trade name of SU-8™, originally developed by International Business Machines (IBM) and now sold by the USA company, MicroChem Corporation, and Gersteltec Engineering Solutions, a Swiss-based company. The SU-8™ may be chosen for thick patterns that may exceed 300 microns, with a high-aspect ratio (i.e., height vs. width), and with the pattern definition to exhibit straight sidewalls. Because of the unique characteristics of the SU-8™ epoxy resin, photoresists of this variety may be chosen to manufacture large devices, and may include microeletromechanical systems (MEMS). The varieties of negative-tone photoresists may be different from positive, their cleaning (removal) practice may be even more rigorous. The SU-8™ photoresist may be considered to be a permanent system, removed only with more complex, time, and costly practices. Processes according to the present disclosure may be particularly advantageous for the removal of thick substrates like the SU-8™ photoresists.

As with many processes involving photolithography, it may be desirable to completely remove the photoresist from the substrate before proceeding to the next process. Incomplete stripping of the photoresist may result in irregularities during the next etching or deposition step, which may cause quality and yield problems. For example, during solder bumping, resist contamination may prevent metal solder from wetting to a metal pad during the board assembly reflow processes, resulting in yield loss in a finished assembly. The same photoresist contamination may be manifested as organic contamination in front end of line device (FEOL) patterning and may result in the same non-wetting problems in an etch or deposition process. Such irregularities, no matter how small, may continue to magnify the problem throughout manufacturing until, during final device assembly and testing, the condition may lead to poor mechanical and electrical contacts, which produce high resistance and heat, or worse, catastrophic electrical shorting.

Throughout each of these chemical processes, selectivity in cleanliness and high throughput should be met without failure. Any problems associated with a lack of performance, presence of residue, or worse, a rise in process complexity, each may result in reduced yield and increased cost.

The chemistry of positive-tone resists may be hydrophilic (polar) and amorphous (i.e., non thermoset and cross-linked), and it may be easier to clean (remove) using conventional solvents and/or chemical strippers. The resins for positive-tone chemistries may be based upon either Novolac (cresol, phenol-formaldehyde) or polyhydroxystyrene (Phost), with options of styrenated copolymer and/or acrylic/PMMA (polymethylmethacrylate). These chemistries may offer good adhesion and fixing to a wide variety of surfaces while the hydroxyl groups present in the various forms of Novolac (i.e. cresol, bis-phenol, etc.) may provide intermolecular hydrogen bonding that aids in aqueous solubility. This condition may combine during the photoconversion of the initiator diazonaphthoquinone (DNQ) in Novolac systems, while in Phost systems, the acid catalyzed de-protection of the ester forms the more soluble alcohol. When used during operating conditions up to and including 100° C., these systems remain soluble in polar solvents while their UV-exposure will produce counterparts that are soluble in aqueous-base.

The positive-tone resists may be used as primary imaging masks for plasma-based etching. During this process, species in the plasma may produce etch residue while exposing the mask to temperatures exceeding 150° C. Etch residue (e.g. side-wall polymer) may be comprised of by-products of the plasma with organic constituents of photoresist. The chemistry of the residue may comprise constituents of the substrate, metal topography, and plasma gases, to include silicon, gallium, arsenic, boron, phosphate, titanium, tantalum, tungsten, copper, nickel, aluminum, chromium, fluorine, chlorine, as well as carbon containing compounds. In Novolac systems that contain hydroxyl constituents, these elevated temperature exposure conditions may facilitate further reactions to form insoluble species. The reactivity of hydroxyl groups with halides and active metals, especially in the heated and acidic conditions of a plasma, to produce alkyl halides, esters, and, in some cases, high molecular weight polymers is known (Morrison, R. T. and Boyd, R. N., *Organic Chemistry, 3rd Ed.*, Allyn & Bacon, Inc., Boston Mass., Ch. 16 (1973)). Cleaning of etch residue and overexposed photoresist masks resulting from the effects of hot plasma etching may require the use of chemical strippers processed at elevated temperatures for extended periods of time dependent upon the process and tool.

Measurements used to predict stripping challenges of bulk resins include, for instance, thermal analysis determination of glass transition (Tg). Relatively unchanged Tg values may be observed in positive-tone photoresists and similar amorphous systems (Fedynyshyn, T. et al., *Proc. SPIE* 6519, 65197-1 (2007)). Detectable increases of Tg in photoresists may be a function of the evaporative loss in solvent, which in turn, may depend upon the thickness of the photoresist coating. Most notable are observed increases in Tg with radiation and thermal exposure with polymer cross-linking (J. D. D'Amour et al., *Proc. SPIE* 5039, 966 (2003)). Such cross-linking of high temperature exposed Novolac resins and negative-tone systems is consistent with the presence of higher molecular weight species as detectable by increased values of Tg.

Cleaning (removal) of photoresist etch residue and the mask use complex chemical strippers composed of organic solvents, amines, water, reducing agents, chelating agents, corrosion inhibitors, and surfactants. The reducing agent, hydroxylamine, has been cited in the literature as a basic material that may facilitate dissolution of photoresist and its residue while offering protection of underlying aluminum metal features. The use of stripper chemistries may involve the delivery of large volumes of stripper to the substrate to be cleaned at a specific temperature for a given period of time.

As the industry continues to replace aluminum with copper to capture improved performance in their devices, the stripper chemistries must also be adjusted. Hydroxylamine may be acceptable for cleaning of aluminum devices; however, it may be too aggressive for copper. Device architecture using copper and low-K (dielectric constant, K), e.g. Cu/Low-K, may require fluorinated-based chemistries to remove silicon-laden etch residue. Amines and ammonia compounds are known to be complexing agents for Cu and may etch (attack) copper metal.

Negative photoresists used in forming wafer bumping metallization masks may include acrylic, styrenic, maleic anhydride or related monomers and copolymers. Such materials may be used to produce photosensitive thick films. These photoresists may be referred to as "acrylic" polymer systems due to the pendant groups on the main polymer chains, which include vinyl groups common to acrylics. The dry-film form of acrylic photoresists may be chosen where exposure to rigorous process conditions is required. As a result of this exposure, the cleaning of dry-film masks and residues may present a stripper challenge.

Resist stripping compositions that include aromatic quaternary ammonium hydroxide such as benzyltrimethylammonium hydroxide (BTMAH), a solvent such as an alkylsulfoxide, a glycol and a corrosion inhibitor and nonionic surfactant may not completely remove many dry-film resists from a wafer surface. Similarly, compositions using pyrrolidone-based solvents such as N-methylpyrrolidone (NMP) exhibit the same drawback in that they cannot achieve complete removal of many dry-film resists. In general, compositions that include a quaternary ammonium hydroxide such as tetramethylammonium hydroxide (TMAH) in NMP may not completely dissolve many dry-film resist. As discussed above, incomplete dissolution may produce particles that can become a source of contamination resulting in yield loss.

Similar experience may be noted for negative-tone photoresist of the rubber-based resin variety. Stripper chemistries that may be used to clean residue and masks resulting from rubber photoresists may include a hydrocarbon solvent and an acid, commonly a sulfonic acid. High acidity may be required for performance and emulsification of hydrolyzed rubber components. Representative inhibitors include, but are not limited to, mercaptobenzotriazole (MBT) and related triazoles to, for instance, prohibit attack upon adjacent metallic features. An exemplary inhibitor for these chemistries includes catachol, a toxic and carcinogenic material. Further, rinse steps for hydrocarbon strippers of this variety should use isopropanol (IPA) or related neutral and compatible solvents. This rinse practice, albeit a cost increase, may reduce the effects of metal attack to adjacent metals due to a pH-drop during water mixing with constituents of the stripper. Due to compatibility issues, wastes from the use of hydrocarbon-based strippers should be segregated from normal organic streams in a microelectronic fabrication.

Further, a cleaning tool may provide control in the process. Variability between part batches may be reduced by the operation of the tool. Barring any mixing or chemical adjustments made by the unit, the variables available to the tool for control include temperature, agitation, and time. With an ever-present intensive pressure to increase throughput in a manufacturing line, a constant emphasis is to decrease the process time. Again, without a change in chemistry, temperature and/or agitation may be increased with the expectation that polymer dissolution rates may increase resulting in shorter process time. However, other reactions that are contradictory to the objectives of the process, such as corrosion rate, may also increase with increased temperature and/or agitation. Continued loading of the stripper chemistry with the organic substance may cause a reduction in bath life and may accelerate the observation of residue or other phenomena that indicate a drop in performance. Further all wafers do not experience the exact same stripping environment, thus causing some amount of process variation.

On the temperature continuum, bath life may be facilitated by increasing temperature and/or agitation. Where agitation should be controlled to protect substrate features, bath life conditions may be increased through increased polymer dissolution with increasing temperature. There is a fundamental safety limit as communicated by industry guidelines (SEMI S3-91, *Safety Guidelines for Heated Chemical Baths*). Particularly when processing in baths, in accordance with SEMI, liquid over temperature shall be controlled at not more than 10° C. above the normal operating temperature of the liquid, where the typical operating temperature does not exceed the flashpoint of the liquid. Many companies set policy that is more restrictive such as operating at 10° C. below the flashpoint and setting the over temperature to be the flashpoint. These criteria and others may be observed in the processing of flat panel displays (FPDs).

Resist stripping at a FPD manufacturing plant may occur on large substrates traveling on a conveyor from one chamber to another. The resist may be stripped from the panel by a stripper delivered by a sprayer that floods the entire glass surface, traveling to a rinse stage where distilled, deionized, or demineralized water or an alternative solvent may be sprayed onto the surface, and the process may be completed with a drying step that may include a hot air knife. Stripping may be supported by at least two product tanks that are separate and distinct and arranged in-line with the flow direction of the parts. Substrates entering the tool may be first "washed" by the chemistry in the first tank. The stripper may be sprayed onto the substrate surface, and upon reacting with the resist and flowing off of the substrate, it may be collected and returned to the tank where it may then be heated and filtered such that any suspended and undissolved materials may be removed from the bulk chemistry. The filtered and heated stripper may be then cycled back to the spray chamber where it may be delivered to the substrate in a continuous manner that optimizes the resist stripping process.

As the part travels on the conveyor from the first chamber supported by tank #1 to the next chamber supported by tank #2, there may be a purity change in the stripper. Although the conditions of operation for tank #2 may be the same as that for tank #1, the amount of resist present may be lower than that for tank #1. Typical processing times may be defined for chamber #1 to offer a dwell time of the chemistry in contact with the resist that may optimize resist stripping and maximum removal. Over time, tank #1 may reach a maximum loading capacity for dissolved resist and a decision to replace the contents may be necessary. When this occurs, the contents of tank #1 may be sent to waste and replaced by the contents of tank #2. The contents of tank #2 may be replaced with fresh stripper (i.e. pure stripper). In this manner, the system may be said to operate in a counter-current fashion. Namely, the process flow of parts may be "counter" or opposite to the flow direction of the chemistry. By using this practice, tanks #1 and #2 may become the dirty and clean tanks, respectively. In other words, the unwanted resist may be concentrated in the front of the line while the cleanest chemistries remain near the end whereby after this point, the product substrate may be rinsed and dried.

The configuration given above for the FPD example may be consistent with many, if not all, in-line bench style tools and with many batch style-processing tools. In a bench tool, parts may move from one station to another while the tanks are at fixed locations. In a batch style tool, the parts may rotate but remain at a fixed location, while the chemistry may be delivered by spraying. There may be two tanks, the tool may pump from one or the other and carry-out counter-current cleaning designs by the use of "dirty" and "clean" tanks.

There is a yet unsatisfied need to achieve selectivity during processing with these formulated strippers. Namely, as the use of more aggressive chemistries may be put into practice to achieve a desired cleaning performance in ever reducing time, this practice should be met without damage to sensitive metals and the underlying substrate. This may be challenging as many of the acids or alkalis of choice may rapidly "spike" the pH of the system, once they are mixed with water during the rinse step, causing galvanic corrosion to substrate metals. During the rinse stage on a FPD line, water may be sprayed on the heated glass surface that contains residual stripper. No surfactants are used in a FPD line, for fear that a foam condition may occur and cause catastrophic failing of filters, pumping of dry air bubbles, and worse, contaminating the fabrication facilities by overflowing stripper that may trigger electrical shorting and lead to a fire. Since no surfactants are used, there may be irregular diffusion due to rising surface tension from the organic stripper to the aqueous condition. Irregular mixing and spreading may cause momentary dead spots on the panel, which may contribute to accelerated corrosion. The corrosive by-product and foaming condition may be avoided through rinsing with neutral solvents such as isopropanol (IPA). Although this practice may be acceptable to several FPD manufacturers, it is expensive and a flammability hazard.

There is a need, accordingly, for new processes, apparatus and improved stripping compositions that may remove the processed resist in a rapid manner while maintaining safety towards the underlying metallurgy during rinsing with distilled, deionized, or demineralized water, and preventing corroding, gouging, dissolving, dulling, or otherwise marring the surfaces throughout the entire process. Further, growing initiatives exist within the industry to move toward being "green." A green process and the associated chemistries are those which may reduce or eliminate the use and generation of hazardous substances. According to the *American Chemical Society's Green Chemistry Institute*, there are twelve (12) principles that help to define a green chemistry.

Where organic dielectrics are used, there may be a continuing need for processes and compositions that may be used to effectively re-work a cured polymer by dissolving and cleaning the unwanted material from the underlying substrate. In cases of positive photoresists, there may be a similar and continuing need for processes, apparatus, and compositions to effectively remove polymer from a substrate without deleterious effects to adjacent metal features. Finally, in the case of negative-tone photoresists, the same need exists for processes and compositions to effectively remove polymer from a substrate without deleterious effects to adjacent metal features.

While there is a desire to address the removal needs of organic substances with unique compositions, there also, is a challenge to design a process that is supported by an apparatus that may enable rapid processing of parts, that may enable a higher level of consistency of the chemistry applied to the parts, and rinsing without deleterious effects to the substrate. There is a continuing emphasis for the microelectronics industry to be green through improving the safety of operations, reducing the use of chemistry, and reducing the generation of hazardous waste. Taking these challenges together, there is a need to provide a consistent process, which uses compositions of matter that vary depending upon the end product to be produced and the performance needs of the polymer or residue to be removed, which provides high performance, high throughput, a green process, at a reduced cost of ownership.

SUMMARY

A first embodiment of the present disclosure concerns a single-stage process for removing an organic substance from a substrate comprising, coating the organic substance with a stripping composition to a thickness of 1000 microns or less; heating the substrate to a temperature and for a time sufficient to release the organic substance, and rinsing the substrate with a volume of a rinsing agent sufficient to remove the composition and the organic resin.

Another embodiment concerns a process for removing an substance from a substrate comprising, coating the substance with a stripping composition comprising i) at least one organic solvent at a weight percent ranging from 0.5% to 99.5%, and ii) at least one water soluble, water dispersible, or water dissipatable sulfonated polymer or sulfonated monomer at weight percent ranging from 0.1% to 99.5%; heating the substrate to a temperature above the flashpoint of the organic solvent for a time sufficient to release the organic substance, and rinsing the substrate with a volume of a rinsing agent sufficient to remove the composition and the organic resin.

Yet another embodiment concerns A process for removing a substance from a substrate comprising, coating the substance with a stripping composition to a thickness of 1000 microns or less; heating the substrate to a temperature and for a time sufficient to release the substance from the substrate, and rinsing the substrate with a volume of a rinsing agent sufficient to remove the composition and the substance, wherein the rinsing agent comprising at least one surfactant.

Still another embodiment concerns a process for removing an organic substance having a thickness of 10 micron or greater from a substrate comprising, coating the organic substance with a stripping composition comprising i) at least one organic solvent at a weight percent ranging from 0.5% to 99.0%, and ii) at least one water soluble, water dispersible, or water dissipatable polymer or monomer at weight percent ranging from 0.1% to 99.0%; heating the substrate to a temperature above the flashpoint of the organic solvent for a time sufficient to release the organic substance, and rinsing the substrate with a volume of a rinsing agent sufficient to remove the composition and the organic resin.

DETAILED DESCRIPTION

The present disclosure provides processes with associated apparatus and stripping compositions which may quickly and effectively remove polymeric organic substances from, for instance, inorganic substrates, including metallic, non-metallic, and metalized non-metallic substrates or from, for instance, organic substrates, including polymeric substrates, plastics, and wood based substrates or from, for instance, carbon based materials, including graphene, graphite and organic siloxanes, e.g, silsesquioxane.

In one embodiment, the stripping composition comprises a water-soluble sulfonated polymer or monomer and various additives, which effectively remove organic substances and their residues of thermoplastic or thermoset nature that comprise the basis for fabricating microcircuits in electronic manufacturing. According to one embodiment, the process may define a practice of coating the composition onto the substrate, heating the substrate to a specific temperature for a given time sufficient to achieve modification including both dissolution and/or release of the organic substance from the substrate, and finishing with removal of the by-product by rinsing with a rinsing agent, such as water. The process, associated apparatus and composition may work together to provide performance and other desired goals in manufacturing that may not be seen in conventional stripper processes. For example, the processes of the disclosure can enhance consistency between the chemistry applied to any single substrate or batch in a multi-substrate or multi-batch process. Additionally although the organic substances to be removed may be thick or may be cured to a hard and chemically resistant framework because of the nature of the customer's process, the processes, associated apparatus, and compositions of the present disclosure are found to maintain acceptable performance despite the recognized difficulties associated with stripping these materials.

The processes and compositions of the present disclosure may have application in the manufacture of a variety of devices including but not limited to semiconductor wafers, RF devices, hard drives, memory devices, MEMS, photovoltaics, Displays, LEDs, wafer level packaging, solder bump fabrication and memory resistor fabrication. Other processes in which the cleaning methods and compositions as disclosed may also be useful, include without limitation removal of photoresists (BEOL, FEOL), post-metallization, or post etch residues, post implantation residues, lift-off (controlled corrosion), rework of passivation layers, and photoresist rework.

The processes, associated apparatus and compositions of the present disclosure may have particular applicability to semiconductor wafer fabrication. Organic substances are present, for example, on post-etched wafers during front-end processing or in back-end wafer-level-packaging during a wafer bumping process. The compositions and methods are particularly suitable for the removal from wafers of hard-to-remove materials such as full-cure polyimide and dry-film photoresist residues.

While the present disclosure provides stripping compositions and processes that can effectively remove polymeric organic substances from a substrate, it may also be adapted for removing photoresists that include positive-tone of both Novolac (i.e. cresol formaldehyde) and polyhydroxy styrene (Phost), negative-tone varieties to include acrylics, isoprene (i.e. rubber), and epoxy (i.e. SU-8™), as well as dielectrics to include polyimide, polybenzoxazole (PBO), and bisbenzocyclobutene (BCB). The compositions and methods may also remove other photoresists, for example, multi-layer photoresists and chemically amplified photoresists. These organic substances may be employed in the fabrication of substrates, for example, the electronic devices on substrates such as wafers or flat panel displays, which may include various layers and structures such as metal, semiconductor, and the associated organic materials. Exemplary substrate materials include, for example, semiconductor materials such as silicon, gallium arsenide, indium phosphide, and sapphire, as well as glass and ceramic. Finally, the composition and methods may also be used to remove other organic substances, including adhesives, paints, powder coatings, passivation materials, dielectric materials, organoelectric materials, etch residues on photovoltaics, post etch residues during radical formation and pattern media or metallization in wafer fabrication.

Whenever the term "water-dissipatable" or "water-dispersible" is used in this description, it may be understood to refer to the activity of a water or aqueous solution on the monomer or polymer (Component B). The term is specifically intended to cover those situations wherein a water or aqueous solution dissolves and/or disperses the monomer or polymer material therein and/or therethrough.

The terms "stripping," "removing," and "cleaning" are used interchangeably throughout this specification. Likewise, the terms "stripper," "remover," and "cleaning composition" are used interchangeably. The term "coating" is defined as a method for applying a film to a substrate such as spray coating, puddle coating, slit-coating or immersing. The terms "film" or "coating" are used interchangeably. The indefinite articles "a" and "an" are intended to include both the singular and the plural. All ranges are inclusive and combinable in any order except where it is clear that such numerical ranges are constrained to add up to 100%. The term "wt %" means weight percent based on the total weight of the components of the stripping composition, unless otherwise indicated.

A process according to one embodiment of the present disclosure involves submerging the substrate in a bath of the composition according to the present disclosure. Once the substrate is submerged in the composition heating of the substrate may begin. A rapid rate of heating may occur until the desired temperature is reached and is held for a desired period of time. Alternatively, the bath into which the substrate is submerged may be maintained at the desired temperature. Rinsing with a rinsing agent may occur and may be followed by a drying step. Rinsing according to this embodiment may be done by submerging the substrate in a rinsing bath or by spraying with an appropriate rinse agent.

According to another embodiment of the disclosure a composition according to the present disclosure or another stripping composition is applied as a liquid coating in direct contact with the organic substance to be removed. Coating may be carried out by any art recognized coating method. According to one embodiment, for example, in microelectronic manufacturing, spin coating may be a method of choice used to apply coatings to a substrate. However, other methods exist and include spray coating, spray-spin coating and slit coating for large substrates such as in FPD manufacturing. In all cases, the objective is to apply the composition in a manner to achieve complete coverage. Many coating applications are concerned with a high degree of uniformity. In this disclosed method, the application of the coating is performed in a manner such that good control over the volume of the stripping composition applied to the substrate is maintained, for example to minimize the total volume of the stripping composition. In this disclosed method, a thickness shall be established, for instance on the order of a maximum value of 1000 microns (1 $\mu m = 1 \times 10^{-6}$ m), but some cases where the organic substance is very thin, the composition thickness may be smaller. In one embodiment of the present disclosure, the coating can be up to 800 microns thick, from 200 to 600 microns thick, or from 300 to 400 microns thick.

Spin-coating the composition for this disclosure may involve dispensing the material at the center of a substrate, and operating the equipment at a low rate of circular motion speed (i.e. 100 revolutions per min, rpm, or less). Liquid delivery may be done by a static method, whereby the fluid may "puddle" onto the surface.

A dynamic method may also be used where the material is dispensed when the substrate is already in motion. During the early stages for a new process set-up, the exact conditions of rpm and time may need to be established in such a manner to ensure complete coverage of the substrate with minimal or no waste. There is no need to be concerned with edge bead formation as this condition may be irrelevant to the process objective; however, a bumper of edge gasket can be used if desired for the particular application. A bumper of gasket may be desired where the physical properties of the substrate or stripping composition prevent the composition from remaining in contact with the substrate.

The manipulation of spin-speed may be a focus of many apparatus used in the microelectronics industry. Substrate rotation may have a direct affect on these properties and produce different coating results. At low spin-speeds, fluid mobility may be low with minor material loss, however, irregularities in substrate coverage may also occur. Alternatively, high spin-speeds may result in high mobility and high material loss. Although spin-coating is a standard practice in the industry, coatings, including thick coatings, of acceptable thickness and uniformity may be achieved with a spray-coating practice.

Whether being applied in static or dynamic form, the compositions of the present disclosure may be applied from one or multiple applicators or spray heads. In a design where the substrate holder includes more than one substrate, the stripping composition and or rinse agents may be applied to each substrate by one or more applicators. According to one embodiment, the substrates may be treated with a small amount of stripping composition to "prewet" the surface before full application of the stripping composition. This prewet may result in more uniform application of the stripping composition to the substrate surface and thereby result in more uniform removal of the organic substance. Prewet may be carried out using a small amount of stripping composition or it may be carried out with any material which will wet the surface of the substrate thereby facilitating the application of the stripping composition, for example, a surfactant. Specifically, a prewet material would be selected to aid in the compatibility of the particular substrate to be cleaned with the stripping composition selected.

Heat application may be accomplished by any art recognized method. A simple hot-plate may be used. This requires the substrate to be moved from one location to another. In situations where automation is of interest, the wafer may remain stationary while heat is applied using any art recognized method, including, but not limited to, down or top-side heating, for example, overhead radiative and/or convective heating, infrared heating, convective heating, heating with a graphite heater, bathing the substrate in heated nitrogen gas, electrostatic or other physical heating of the substrate holder, for example, backside heating through, for example, a conductive or dielectric material or any combination thereof. Exact ergonomics and logistic concerns with respect to controls and throughput can be readily determined by those skilled in the art of tool design.

According to another embodiment, the apparatus may be modified in any art recognized manner to improve heating of the substrate. In one embodiment, the apparatus and/or the stripping composition are modified. Specific examples of modifications that may improve heating include but are not limited to rendering the substrate holder reflective, either IR or conductive, rendering the chamber for carrying out the stripping process reflective, for example, by including an IR reflector in the chamber, or adding a dye to the stripping composition that will absorb IR and provide improved heating at the substrate surface. In another embodiment, the substrate is rotated during application of heat to achieve uniformity of heating.

In one embodiment, the process includes heating anywhere from 25° C. to 400° C. In another embodiment, the method includes heating anywhere from 100° C. to 250° C., for instance, 100° C. to 200° C. According to one embodiment, the process includes heating to a temperature above the flash point of the organic solvent that is present in the stripping composition. Variability in temperature may depend upon the nature and thickness of the organic substance. According to one embodiment, the substrate is heated to a uniform surface temperature. According to another embodiment, the surface can be heated in a non-uniform but predetermined pattern.

The heating step process time may, for instance, range from 5 seconds to 10 minutes, from 10 seconds to 8 minutes, or even from 30 seconds to 4 minutes. Moreover, the entire process time may, for instance, range from less than 15 seconds to 180 seconds or from 5 minutes to 10 minutes. The variability in time may depend upon the material to be removed, its thickness, and exposure condition. For example, for a Phost or Novolac resin, the heating step could be from 15 seconds to 1 minute. However, for other, more highly cured resins, the heating step may last from 2 to 4 minutes or even longer.

Heating may be carried out after application of the cleaning solution or heating may be assisted or accomplished through a preheating step. The preheating step can comprise the preheating of the substrate itself, the preheating of the surrounding atmosphere, the preheating of the cleaning solution or any combination of the above. The substrate may be preheated to the desired processing temperature or it may be heated to an intermediate temperature thereby reducing cycle times and improving the efficiency of the stripping composition. Preheating of the stripping composition can result in faster cycle times by lowering viscosity and improving wetting. The stripping solution may be preheating by any art recognized method including, for example, convection, IR or exothermic mixing.

According to one embodiment, the substrate is maintained under a controlled atmosphere. Generally, the atmosphere would be controlled either to assist in oxidation or to prevent it. If oxidation were desired, the atmosphere could include the addition of an oxidizing agent, for example ozone. To prevent oxidation, one would generally use an inert atmosphere, such as, a nitrogen or argon atmosphere.

Once the proper heating regime is followed or the desired diffusion or modification of the organic substance is reached, the composition and organic substance may be removed by rinsing with a rinsing agent either in an agitated batch or by direct spray contact. According to one embodiment of the present disclosure, the spinning speed of the substrate holder may be increased after diffusion and modification of the organic substance is complete but before the beginning of the rinse process. These higher spinning speeds can assist in the physical removal of the organic substance. This increase in spin speed can, in one embodiment, be very closely followed by the application of the rinsing agent. In another embodiment the initial application of the rinsing agent is used to flood the substrate further facilitating the physical removal of the organic substance and the spent stripping composition.

Rinsing may be facilitated by the presence of the water-soluble monomer or polymer in the composition. This monomer or polymer performs as a carrier system for the organic substance to be removed from the substrate. The rinsing agent used for rinsing can be at a temperature ranging from 5° C. to 100° C. However, rinsing may also occur at room temperature and in this embodiment may perform two objectives, to remove the dissolved organic substance, and to reduce the temperature of the substrate such that next stage processing may proceed.

Rinsing may be carried in one or more stages or baths or through the application of different rinse agents through one or more applicators in a single stage. Rinsing agents may be applied by applicators in a solid stream, as a spray and/or in atomized form.

According to one embodiment, the rinse is carried out in single step with a rinsing agent, such as water. According to another embodiment, rinsing is carried out by the sequential application of a first rinsing agent including a modifier, for example, a surfactant, followed by a second rinsing agent such as water. Sequential rinsing can include a variety of different rinse agents which provide different benefits depending upon the substrate to be cleaned and the nature of the organic substance to be removed. Sequential rinse agents can include one or more of water, organic or other solvents, IPA, acetone, surfactants, and pH modified water, in any order and manner as will be understood by the skilled artisan for the substrate to be cleaned.

As used herein, the term "rinsing agent" includes any solvent that removes the composition and material to be stripped. Examples of rinsing agents include, but are not limited to, water, pH modified water, acetone, alcohols, for example, isopropyl alcohol and methanol, Dimethylsulfoxide (DMSO), N-methylpyrrolidone (NMP), Glycol Palmitate, Polysorbate 80, Polysorbate 60, Polysorbate 20, Sodium Lauryl Sulfate, Coco Glucoside, Lauryl-7 Sulfate, Sodium Lauryl Glucose Carboxylate, Lauryl Glucoside, Disodium Cocoyl Glutamate, Laureth-7 Citrate, Disodium Cocoamphodiacetate, nonionic Gemini surfactants including, for example, those sold under the tradename ENVIROGEM 360, Oxirane polymer surfactants including, for example, those sold under the tradename SURFYNOL 2502, and poloxamine surfactants, including, for example, those sold under the tradename TETRONIC 701 and mixtures thereof. Further, the rinsing agent can be water containing a sulfonated monomer or polymer according to the invention in an amount ranging from less than 1% to the limit of solubility. The rinse agent containing the stripping composition and organic substance may be captured at the end of the rinse stage and can be discarded, treated, reused and/or recycled, as appropriate.

According to one embodiment, the substrate may be treated in one or more cycles of cleaning, heating and rinsing until the desired level of removal of the organic substance is achieved. According to one embodiment, multiple cycles of the same stripping chemistry and rinsing chemistry may be applied. According to another embodiment, multiple cycles may use different chemistry in one or more cycles and/or different rinse agents in one or more cycles. In yet another embodiment, the heating profile in different cycles may be changed. When different chemical cycles are used, the holder and/or chamber may be cleaned between cycles. Typically cleaning would involve rinsing with water. Additionally, the chamber and holder can be cleaned with, for example, a water rinse between the processing of different substrates or batches.

After rinsing of the substrate, it may be dried. Drying may be accomplished by any art recognized drying method including, but not limited to heat drying, spin drying, gas contact, more particularly an inert gas, which may contact the substrate in a heated and/or pressurized condition, for example, in the form of an air knife. Drying may also be accomplished chemically by the application of an appropriate drying agent, for example, IPA or acetone. Chemical and physical drying techniques may be combined as appropriate In one embodiment, the substrate is dried chemically by the application of IPA or acetone alone. In another embodiment, the substrate is dried chemically, followed by physical drying. In yet another embodiment, the substrate is chemically dried with, for example, IPA or acetone after physical drying. Removal of residual water is particularly important when cleaning substrates including water sensitive components, for example, device architecture including Cu.

According to one embodiment, the process is a single stage process, where the substrate to be cleaned is loaded to a holder. As used herein a "single stage process" refers to a process during which the substrate remains in contact with a single substrate holder throughout the process. According to one embodiment, the holder may remain in a single cleaning chamber or "single bowl" throughout the process or it may rotate or move to one or more of a cleaning chamber, a rinsing chamber and a drying chamber. In one embodiment, the surface of the substrate is contacted with a stripping solution by spraying. The substrate holder may be a static holder or it may be a dynamic holder which can rotate. If the holder is dynamic, the substrate may be coating by spin-spraying. In this embodiment, the substrate may be heated by any method described herein including but not limited to back-side heating or top down heating. The substrate is raised to a uniform temperature across its surface before reaching dryness. Once the desired level of diffusion or modification of the organic substance is achieved, the substrate is rinsed. During rinsing, if the substrate holder is dynamic, it may be spun to facilitate physical removal of the cleaning solution.

According to another embodiment for cleaning a substance from a substrate the process includes a step of selecting or formulating the stripping composition to be particularly suited to the substance to be removed and the particular type of substrate on which it rests. According to one embodiment, the stripping composition may be premixed and loaded to a container or cartridge that can be maintained under controlled environment. This cartridge would be loaded to a cleaning tool which would facilitate the application of the stripping composition, heating and subsequent rinsing of the substrate. According to this embodiment, the rinse agents could also be formulated for the particular substance/substrate and premixed and loaded to the cleaning tool. The use of preloaded solution containers or cartridges can facilitate convenience including simpler operation, reductions in the likelihood that the incorrect stripping solution will be used, cleanliness, ease of disposal and ease of recycling.

Alternatively, the cleaning tool can be configured to include several containers or cartridges each of which includes a component to be used in the stripping composition and/or the rinsing solution. At least one of the containers or cartridges can include water for dilution. According to this embodiment, when the cleaning composition is chosen, the various components are selected and can be combined either in a premixing chamber prior to application to the substrate or on the surface of the substrate to be cleaned. The amount of each component can be controlled manually or by programming the desired composition into an automated system.

According to one embodiment of the invention, the substrate to be cleaned is loaded to a holder that has been configured to hold multiple substrates or wafers. If the holder is dynamic and spins, it is understood that the substrates need to be aligned in a manner that prevents contamination of one substrate by the materials removed from other substrates. Cross-contamination can be avoided, for example, by configuring the holder in a manner which puts no wafer closer to the center than another, for example, in a ring. Furthermore, in this embodiment, application of the cleaning and rinsing solutions can be by a single applicator or by separate applicators for each substrate. According to one embodiment, it is applied by spraying, in some instance, spin spraying. According to this embodiment, the holder can be configured to provide for heating of the wafer or substrate. According to one embodiment the holder can be configured so that the wafer or substrate is back heated. Back heating may be carried out on any material capable of transferring a reasonably even heat to the substrate, for example, a dielectric material, a metal such as aluminum, or Teflon. According to another embodiment, the substrate is in a top down heating configuration however, the substrate holder is configured so that the backside of the wafer contacts as little solid surface as possible, e.g., effectively suspending the substrate in air, thereby improving heat times and uniformity while concurrently minimizing backside contamination. The heating arrangements as described in this embodiment can be used with single wafer holders and multi-wafer holders.

As has been described, the processes and compositions as disclosed can be selected to accommodate the type of product to be cleaned and the particular organic substance to be removed (including changes due to prior processing). The Table below provides examples of organic photoresists, indicates the types of products in which these photoresists are typically used, indicates the types of processes that they will typically be subjected to and pairs that with an exemplary chemistry for their removal. The table provides both a description of the general chemistry that would be selected along with at least one specific example of an appropriate stripping composition.

| Photoresist Family | Process | Generic Formulation | Specific Formulation | Device Type |
|---|---|---|---|---|
| novolac positive i-line resist | photo rework | polar solvent with low vapor pressure | diethylene glycol butyl ether | ALL |
| | post RIE residue: no metal corrosion concerns | water soluble organic base + polar solvent | monoethanolamine + dimethylsulfoxide | BEOL, LED |
| | post RIE residue: with metal corrosion concerns, e.g., Cu | water soluble organic base + polar solvent | tetramethylammonium hydroxide + dimethylsulfoxide | BEOL, LED |
| | post DRIE residue | water soluble organic base + polar solvent | monoethanolamine + dimethylsulfoxide | RF, Packaging |
| acrylic negative i-line resist (liquid) | photo rework: no metal corrosion concerns | water soluble organic base + polar solvent | monoethanolamine + n-methylpyrrolidone | FEOL, LED, RF |
| | photo rework: with metal corrosion concerns, e.g., Cu | water soluble organic base + polar solvent | tetramethylammonium hydroxide + n-methylpyrrolidone | BEOL, WLP |
| | post RIE residue: no metal corrosion concerns | water soluble organic base + polar solvent | monoethanolamine + n-methylpyrrolidone | BEOL, LED |
| | post RIE residue: with metal corrosion concerns, e.g., Cu | water soluble organic base + polar solvent | tetramethylammonium hydroxide + n-methylpyrrolidone | BEOL, LED |
| | post DRIE residue: | water soluble organic base + polar solvent | monoethanolamine + n-methylpyrrolidone | RF, Packaging |
| | post implant residue | water soluble organic base + polar solvent | monoethanolamine + n-methylpyrrolidone | FEOL |
| | post-metallization residue: no metal corrosion concerns | water soluble organic base + polar solvent | monoethanolamine + n-methylpyrrolidone | WLP |
| | post-metallization residue: with metal corrosion concerns, e.g., Cu | water soluble organic base + polar solvent | tetramethylammonium hydroxide + n-methylpyrrolidone | WLP |
| acrylic negative i-line resist (dry) | photo rework: no metal corrosion concerns | water soluble organic base + polar solvent | monoethanolamine + n-methylpyrrolidone | WLP |
| | photo rework: with metal corrosion concerns, e.g., Cu | water soluble organic base + polar solvent | tetramethylammonium hydroxide + n-methylpyrrolidone | WLP |
| | post-metallization residue: no metal corrosion concerns | water soluble organic base + polar solvent | monoethanolamine + n-methylpyrrolidone | WLP |
| | post-metallization residue: with metal corrosion concerns, e.g., Cu | water soluble organic base + polar solvent | tetramethylammonium hydroxide + n-methylpyrrolidone | WLP |
| polyhydroxystyrene positive KrF resist | photo rework: no metal corrosion concerns | water soluble organic base + polar solvent | monoethanolamine + n-methylpyrrolidone | FEOL |
| | photo rework: with metal corrosion concerns, e.g., Cu | water soluble organic base + polar solvent | tetramethylammonium hydroxide + n-methylpyrrolidone | BEOL |
| | post RIE residue: no metal corrosion concerns | water soluble organic base + polar solvent | monoethanolamine + n-methylpyrrolidone | FEOL |
| | post RIE residue: with metal corrosion concerns, e.g., Cu | water soluble organic base + polar solvent | tetramethylammonium hydroxide + n-methylpyrrolidone | BEOL |
| | post implant residue | water soluble organic base + polar solvent | monoethanolamine + n-methylpyrrolidone | FEOL |
| acrylate positive ArF resist | photo rework: no metal corrosion concerns | water soluble organic base + polar solvent | monoethanolamine + n-methylpyrrolidone | FEOL |
| | photo rework: with metal corrosion concerns, e.g., Cu | water soluble organic base + polar solvent | tetramethylammonium hydroxide + n-methylpyrrolidone | BEOL |
| | post RIE residue: no metal corrosion | water soluble organic base + | monoethanolamine + n- | FEOL |

| Photoresist Family | Process | Generic Formulation | Specific Formulation | Device Type |
|---|---|---|---|---|
| | concerns post RIE residue: with metal corrosion concerns, e.g., Cu | polar solvent water soluble organic base + polar solvent | methylpyrrolidone tetramethylammonium hydroxide + n-methylpyrrolidone | BEOL |
| | post implant residue | water soluble organic base + polar solvent | monoethanolamine + n-methylpyrrolidone | FEOL |
| Polyisoprene negative i-line resist | photo rework: no metal corrosion concerns | water soluble strong organic acid + nonpolar solvent | dodecylbenzene sulfonic acid + Aromatic 100 solvent | LED, WLP |
| | photo rework: with metal corrosion concerns, e.g., Cu | water soluble strong organic acid + nonpolar solvent | dodecylbenzene sulfonic acid + Aromatic 100 solvent | LED, WLP |
| | post-metallization residue: no metal corrosion concerns | water soluble strong organic acid + nonpolar solvent | dodecylbenzene sulfonic acid + Aromatic 100 solvent | LED, WLP |
| | post-metallization residue: with metal corrosion concerns, e.g., Cu | water soluble strong organic acid + nonpolar solvent | dodecylbenzene sulfonic acid + Aromatic 100 solvent | LED, WLP |

According to yet another embodiment of the present disclosure, the processes as described above may be enhanced through the application of megasonics. Megasonics may be applied, for example, during the application of the stripping composition and/or after application of the stripping composition and/or during heating of the stripping composition and/or during the application of the rinsing agents. Megasonics may be applied to the wafer itself, to the substrate holder or it may be applied through the stripping or rinsing compositions.

The various compositions, elements of the process, associated apparatus and embodiments as described herein are understood to be useful in any combination. Without providing an exhaustive list of each contemplated combination of stripping composition, coating method, heating method, rinsing method, such combinations are contemplated and embodied in this disclosure.

Compositions of matter used in this disclosure include a major component to be a solvent system of the varieties that may include one or more esters selected from the group consisting of structures (I) R—$CO_2R_1$, glycol ether esters of structures (II) $R_2$—$CO_2C_2H_4(OC_2H_4)_n$—$OR_3$, (III) $R_4$—$CO2C3H_6(OC_3H_6)_n$—$OR_5$ and (IV) $R_6OCO_2R_7$, alcohols selected from structures (V) $R_8OH$, (VI) $R_9OC_2H_4(OC_2H_4)_nOH$, (VII) $R_{10}OC_3H_6(OC_3H_6)_nOH$, (VIII) $R_{11}(OC_2H_4)_nOH$, and (IX) $R_{12}(OC_3H_8)_nOH$, ketones selected from structures (X) $R_{13}COR_{14}$, sulfoxides selected from structure (XI) $R_{15}SOR_{16}$, and amides such as N,N-dimethyl formamide, N,N-dimethyl acetamide, and N-methylpyrolidone, wherein R, $R_1$, $R_2$, $R_3$, $R_4$, $R_5$, $R_6$, $R_7$, $R_8$, $R_9$, $R_{10}$, $R_{11}$, $R_{12}$, $R_{13}$, $R_{14}$, $R_{15}$, and $R_{16}$ are independently selected from hydrogen or $C_1$-$C_{14}$-alkyl groups and n represents a repeating unit ranging from 1 to 10. Further, suitable solvents include, but are not limited to, ketones such as cyclohexanone, 2-heptanone, methyl propyl ketone, and methyl amyl ketone, esters such as isopropyl acetate, ethyl acetate, butyl acetate, ethyl propionate, methyl propionate, gamma-butyrolactone (BLO), ethyl 2-hydroxypropionate (ethyl lactate (EL)), ethyl 2-hydroxy-2-methyl propionate, ethyl hydroxyacetate, ethyl 2-hydroxy-3-methyl butanoate, methyl 3-methoxypropionate, ethyl 3-methoxy propionate, ethyl 3-ethoxypropionate, methyl 3-ethoxy propionate, methyl pyruvate, and ethyl pyruvate, ethers and glycol ethers such as diisopropyl ether, ethyleneglycol monomethyl ether, ethyleneglycol monoethyl ether, and propylene glycol monomethyl ether (PGME), glycol ether esters such as ethyleneglycol monoethyl ether acetate, propyleneglycol methyl ether acetate (PGMEA), and propyleneglycol propyl ether acetate, aromatic solvents such as methylbenzene, dimethylbenzene, anisole, and nitrobenzene, amide solvents such as N,N-dimethylacetamide (DMAC), N,N-dimethylformamide, and N-methylformanilide, and pyrrolidones such as N-methylpyrrolidone (NMP), N-ethylpyrrolidone (NEP), dimethylpiperidone, 2-pyrrole, N-hydroxyethyl-2-pyrrolidone (HEP), N-cyclohexyl-2-pyrrolidone (CHP), and sulfur containing solvents such as dimethyl sulfoxide (DMSO), dimethyl sulfone and tetramethylene sulfone. Although these organic solvents may be used either individually or in combination (i.e., as mixtures with others), some embodiments of the solvent system contain diethylene glycol (DEG, Eastman Chemical Company), diethylene glycol monomethyl ether (DM SOLVENT, Eastman Chemical Company), diethylene glycol monoethyl ether (DE SOLVENT, Eastman Chemical Company), or diethylene glycol monopropyl ether (DP SOLVENT, Eastman Chemical Company), diethylene glycol monobutyl ether (DB SOLVENT, Eastman Chemical Company) halogenated solvents including, for example, benzylchloride, hydrocarbon based solvents including, for example, those sold under the tradenames AROMATIC 100 and AROMATIC 150, sulfuric acid, or mixtures thereof.

According to another embodiment, the compositions of the present disclosure comprise one or more solvents chosen from solvents comprising at least one ethylene glycol moiety or at least one propylene glycol moiety, wherein the length of the at least one ethylene glycol moiety or the at least one propylene glycol moiety ranges from 1 to 5 carbon atoms. Further, at least one end group of the solvent may comprise ether functionality or alkyl ether functionality, where the at least one end group has a length ranging from 1 to 6 carbon atoms.

In some embodiments, the solvent is selected from the one or more of ethylene glycol, diethylene glycol, propylene glycol, diethylene glycol ethyl ether, diethylene glycol methyl ether, diethylene glycol butyl ether, diethylene glycol propyl ether, ethylene glycol propyl ether, ethylene glycol butyl ether, and mixtures thereof.

An embodiment of the composition includes at least one solvent at a weight percent ranging from 0.5 weight percent to 99.5 weight percent. In one embodiment, the solvent is present in the solvent composition at a weight percent ranging from 40% to 97% or at a weight percent from 60% to 90%.

In an embodiment, the composition also contains a monomer, which exhibits the property of water solubility, water dispersibility, or water dissipatability present in a range from 0.1 to 99.5 weight percent and derived from, but not limited to, multifunctional sulfomonomers containing at least one metal sulfonate group attached to an aromatic nucleus that are water soluble or water dispersible or water dissipatible determined 0.1 weight percent, for instance 0.5 weight percent concentration or more (i.e. monomer in water) and the metal of the sulfonate group is Na, Li, K, $NH_4$ and mixtures thereof. The composition includes at least one of these said monomers at 0.1 weight percent to 99.5 weight percent. In one embodiment, the monomer is present in the composition at a weight percent ranging from 0.5 to 99.5 or at a weight percent ranging from 0.1 to 5 or at a weight percent ranging from 1 to 5 or at a weight percent ranging from 2 to 59 or at a weight percent ranging from 5 weight percent to 35 weight percent.

Examples of water soluble monomers may be selected from metal sulfonate salts of isophthalic acid, terephthalic acid, succinic acid, methylene carboxylic acid, and benzoic acid; metal sulfonate salts of a diester of isophthalic acid, terephthalic acid, succinic acid, methylene carboxylic acid, and benzoic acid; or a combination thereof, wherein the sulfonate group is attached to the aromatic nucleus and the metal is selected from lithium, sodium, or potassium and mixtures thereof. In Exemplary monomers include, but are not limited to, 5-sodiosulfoisophthalic acid and salts and esters of the same, such as, the diethylene glycol diester of 5-sodiosulfoisophthalic acid.

In some embodiments, the composition may contain a polymer, which exhibits the property of water solubility, water dispersibility, or water dissipatability present at a range from 0.5 to 99.5 weight percent and derived from, but not limited to, alcohol ethoxylates, bisphenol ethoxylates and propoxylates, alkylbenzene salts, cellulose acetate phthalate, cellulosic derivatives of alkoxyethyl and hydroxypropyl, copolymers of ethylene and propylene oxide, dendritic polyesters, ethoxylated amines, ethoxylated alcohol salts, ethylene acrylic acid, hydroxy-methacrylates, phosphate esters, polyethylene glycols, polyethylene imine, polyethylene oxides, polyvinyl alcohol, polyvinyl pyrollidinone, starch, styrene maleic anhydride, sulfonated acrylics, sulfonated polystyrenes, sulfonated polyamides, sulfopolyester of the linear or branched formula, or rosin acids. The composition may include one or more of these polymers at 1.0 weight percent to 99.5 weight percent. In one embodiment, the polymer is present in the solvent composition at a weight percent ranging from 5.0 to 99.5 or at a weight percent ranging from 10 to 99.5 or at a weight percent ranging from 5.0 to 25.0 or at a weight percent ranging from 1.5 to 60.0 or at a weight percent ranging from 2.0 to 30.0 or at a weight percent ranging from 12.0 to 60.0 or at a weight percent ranging from 15.0 to 30.0.

In one embodiment, the water soluble polymer includes one or more sulfonated polyesters (sulfopolyesters) of the linear or branched varieties respectively, or mixtures thereof. The sulfopolyester is comprised of (i) monomer residues of at least one dicarboxylic acid; and (ii) 4 to 25 mole percent, based on the total of all acid and hydroxyl equivalents, of monomer residues of at least one difunctional sulfomonomer containing at least one metal sulfonate group bonded to an aromatic ring, wherein the functional groups are hydroxy or carboxyl or amino and the metal of the sulfonate group is Na, Li, K, Mg, Ca, Cu, Ni, Fe and mixtures thereof; and optionally (iii) monomer residues of at least one poly(alkyene glycol) having the formula —$(OCH_2CH_2)n$- wherein n is 2 to 500, provided that the mole percent of such residues in inversely proportional to the value of n; and (iv) up to 75 mole percent of monomer residues of at least one diol, wherein said diol is other than a poly(alkylene glycol).

Suitable sulfopolyester polymers for use in this invention are those known as Eastman AQ® POLYMERS and Eastman AQ COPOLYESTERS. Exemplary polymers may include, but are not limited to, polymers prepared from dimethyl-5-sodiosulfoisophthalate and its parent acid and salts, which may be derived from such co-monomers as isophthalic acid, terephthalic acid, succinic acid, benzoic acid, methylene carboxylic acid, and their esters. Diols may be used with such acid co-monomers such as, for example, diethylene glycol, ethylene glycol, triethylene glycol, polyethylene glycol, propylene glycol, 2-methyl propane diol, neopentyl glycol, 1,6-hexanediol, and mixtures thereof.

The polymer may be selected from water soluble, water dispersible, or water-dissipating sulfopolyesters or polyesteramides (herein after referred to collectively as sulfopolyesters) containing ether groups and sulfonate groups having a glycol residue and a dicarboxylic acid residue and at least one difunctional co-monomer containing a sulfonate group attached to an aromatic nucleus and in the form of a metallic salt. Such polymers are well known to those skilled in the art and are available from Eastman Chemical Company under the tradename of Eastman AQ POLYMERS. In particular, such sulfopolyesters can be dissolved, dispersed or otherwise dissipated in aqueous dispersions, preferably at temperatures of less than 80° C. The term "residue" or "component" as used in the specification and concluding claims refers to the moiety that is the resulting product of the chemical species in a particular reaction scheme or later formulation or chemical product, regardless of whether the moiety is actually obtained from the chemical species. Thus, for example, an ethylene glycol residue in a polyester refers to one or more —$OCH_2CH_2O$— repeat units in the polyester, regardless of whether ethylene glycol is used to prepare the polyester.

The aforedescribed polyester material may be prepared by any method known to one of ordinary skill in the art. The use of the term "acid" in the above description and in the appended claims includes the various ester forming or condensable derivatives of the acid reactants such as the dimethyl esters thereof as employed in the preparations set out in these patents. Examples of sulfo-monomers are those wherein the sulfonate group is attached to an aromatic nucleus such as benzene, naphthalene, biphenyl, or the like, or wherein the nucleus is cycloaliphatic such as in 1,4-cyclohexanedicarboxylic acid.

As an alternative to the sulfonated polymer or monomer, the composition may include a sulfonated hydrotrope. Representative hydroptropes include, for example, xylene sulfonate, or an ionomer, chosen from, for example, sulfonated polyamides and sulfonated polystyrenes. A "hydrotrope" as used herein refers to an organic substance that increases the solubility of surfactants and other substances in an aqueous solution. Hydrotropes are not surfactants; they do not adsorb onto the surface or interface and do not form micelles.

Additives to the composition may comprise 100 parts-per-million (ppm) to 99 weight percent of an alkali or acid of organic or inorganic origin to include ammonium hydroxide, quaternary hydroxides and tetra-alkyl ammonium hydroxides or mixed alkyl/aryl ammonium hydroxides, such as tetramethyl ammonium hydroxide (TMAH), tetraethyl ammonium hydroxide (TEAH), and benzyltrimethyl ammonium hydroxide (BTMAH), amines such as triethylene tetramine, alkanolamines that include monoethanolamine, monoisopropanolamine, diglycolamine, elemental hydroxides, or alkoxides such as potassium tertiary butyl hydroxide (KTB), alkylsulfonic acids such as methanesulfonic (MSA), toluenesulfonic (TSA), and dodecylbenzene sulfonic acid (DDBSA), formic acid, fatty acids, sulfuric acid, nitric acid, or phosphoric acids; an inhibitor defined as a protecting agent for substrate composition that may include chelating, complexing, or reducing agents, comprising at least one of the known varieties, including benzylic hydroxides such as catechol, triazoles, imidazoles, borates, phosphates, and alkyl or elemental silicates, ethylenediaminetetraacetic acid, diethylenetriaminepentaacetic acid, nitrilotriacetic acid, and 2,4-pentanedione, reducing sugars, hydroquinones, glyoxal, salicylaldehyde, acids such as citric and ascorbic acid, hydroxylamines, or vanillin; and a surfactant chosen from one or more of the known varieties, including nonionic nonyl-phenols and nonyl-ethoxylates, nonionic Triton and PEG-based surfactants, anionic forms that include alkyl-sulfonates, phosphate esters, and succinates, and fluorinated systems and cationic forms that include quaternary ammonium compounds, polyoxyethylene based amines and imiazoline based surfactants. The additive may be present in an amount ranging from 0.1 weight percent to 95 weight percent, 1.0 weight percent to 50 weight percent, or 5.0 weight percent to 35 percent.

The cleaning composition of the present disclosure can be semi-aqueous or non-aqueous. Water may be added in any amount to achieve the desired cleaning composition. Exemplary compositions may include water in an amount from 5 weight percent to 80 weight percent, for instance from 10 weight percent to 80 weight percent, for instance 20 weight percent to 80 weight percent.

In one embodiment, the cleaning composition includes at least one organic solvent at a weight percent ranging from 0.5 weight percent to 99.0 weight percent, at least one sulfonated polymer or monomer at weight percent ranging from 0.5 weight percent to 99.0 weight percent, and at least one additive that enhances cleaning performance at a weight percent ranging from 0.01 weight percent to 99.0 weight percent.

In another embodiment, the cleaning composition includes the solvent at a weight percent ranging from 30 weight percent to 95 weight percent, the monomer or polymer at a weight percent ranging from 0.25 weight percent to 60 weight percent, and the additive at a weight percent ranging from 2 weight percent to 60 weight percent.

The composition may also include an inhibitor that acts as a protecting agent for the substrate composition. The inhibitors include chelating, complexing, or reducing agents, comprising one or more of the known varieties, including benzylic hydroxides such as catechol, triazoles, imidazoles, borates, phosphates, and alkyl or elemental silicates, ethylenediaminetetraacetic acid, diethylenetriaminepentaacetic acid, nitrilotriacetic acid, and 2,4-pentanedione, reducing sugars, hydroquinones, glyoxal, salicylaldehyde, fatty acids such as citric and ascorbic acid, hydroxylamines, or vanillin.

In one embodiment, the composition includes at least one nitrogen containing compound, e.g., an amine that will react with one or more esters on the sulfonated polymer or sulfonated monomer to form an amide. The amine may be chosen from one or more additives or inhibitors. In one embodiment, the amine compound reacts with two esters on the sulfonated polymer or sulfonated monomer to form a diamide. In one embodiment, the stripping composition includes a combination of diesters, and/or diamides, and/or monoamides. Exemplary amines include, but are not limited to, triethylene tetramine, alkanolamines that include monoethanolamine, monoisopropanolamine, diglycolamine. In another embodiment, the at least one compound that includes a nitrogen substituent is nitric acid. In yet another embodiment, the at least one compound that includes a nitrogen substituent is chosen from triazoles, imidazoles, ethylenediaminetetraacetic acid, diethylenetriaminepentaacetic acid, nitrilotriacetic acid, hydroxylamines, and mixtures thereof. Nitrogen-containing compounds suitable for use herein would be readily apparent to one of ordinary skill in the art. In one embodiment, the at least one compound that includes a nitrogen substituent is present at a weight percent ranging from 0.01% to 99.0%.

The compositions according to the present disclosure may also include a surfactant including at least one of the known varieties, including nonionic nonyl-phenols and nonyl-ethoxylates, nonionic Triton and PEG-based surfactants, anionic forms that include alkyl-sulfonates, phosphate esters, and succinates, dodecylbenzenesulfonate sodium salt, and fluorinated systems and cationic forms that include quaternary ammonium compounds, polyoxyethylene based amines and imiazoline based surfactants.

In an embodiment, the stripping compositions of the disclosure function by maintaining a solvency environment when used on amorphous organic substances such as positive-tone photoresists of the Phost or Novolac varieties. In such cases and when exposure conditions include moderate temperatures up to 150° C., a composition that contains the minimum constituents, including the solvent system and water soluble monomer, may be coated and processed at the conditions of the disclosure method. When heated to a sufficient temperature, rapid dissolution may occur and diffusion of the photoresist into the composition proceeds rapidly to completion. Additives such as an alkali agent, inhibitor, and surfactant may be used to facilitate good results with highly baked (i.e. >150° C.) photoresists. Advantages in using additives contained within the stripping composition may include improved dissolution rates due to saponifying cross-linked photoresist while the inhibitors may protect exposed metal during the stripping and rinsing steps.

Organic alkanolamine compounds may be used for basic reactive modification and emulsification of the positive-tone photoresists, to include one or more low molecular weight candidates, for example, monoethanolamine (MEA), N-(2-aminoethyl)ethanolamine (AEEA), monoisopropanolamine (MIPA), or diglycolamine (DGA), and combinations thereof. In cases where a negative-tone acrylic photoresist or a cured thermoset polyimide are the candidates to be removed, the composition may require a strong alkali, namely, a quaternary hydroxide, metal hydroxide, or alkoxide.

Similar to the review given here for removing coatings and residues compositions also apply for removal of negative isoprene (rubber) resist and negative-epoxy (SU-8™) photoresist. As determined for the positive photoresist and negative acrylic and polyimide, the choice in composition is dependent upon the material to remove. For negative-isoprene, the chemistry is hydrophobic (non-polar) and the cross-linked rubber system does not respond to alkalis, only acids. Rubber photoresists may require aromatic solvents and hydrophobic acids, such as dodecylbenzene sulfonic acid. For negative epoxy photorest, the chemistry is hydrophilic (polar) and like the rubber photoresists, these systems also may not respond to alkalis. In one embodiment, the system is one that incorporates hydrophilic acids such as methanesulfonic acid (MSA) or sulfuric acid. These systems may contain the water soluble polymer or monomer, to facilitate proper rinsing following dissolution of the photoresist.

According to one embodiment, one or more of the processes and/or stripping compositions of the present disclosure may be used to remove thick organic layers, e.g., SU-8™ photoresists that are often considered difficult to remove. As used herein, the term "thick" refers to organic layers having a thickness of 10 μm or greater, 50 μm or greater, 100 μm or greater, or even 400 μm or greater. The processes of the present disclosure are particularly useful in the removal of thick organic layers because they allow the processing temperatures to be raised above those conventionally associated with removal in cleaning solution baths. More particularly, the present invention allows the substrate temperature to be raised above the Tg or flash point which promotes diffusion or penetration of the stripping composition through the thick organic photoresist layer. The diffusion and penetration of the stripping composition solution through the photoresist can result in much more rapid removal of thick organic substance than was heretofore possible.

The processes and/or stripping composition of the present disclosure may, in one embodiment, be used to remove a single layer, e.g., organic layer, from the substrate in a single pass application of the stripping composition. Additionally, they may be used to remove a single layer in multiple applications by partially removing the layer upon each application. Further, the apparatus, processes and/or stripping compositions of the present disclosure can be used to remove multiple layers of organic material. These layers, like the single layer, may be removed in a single application of stripping composition or in multiple applications of the stripping composition. Furthermore, when multiple layers of organic material are removed, the stripping compositions used to remove them may remain constant or may be changed as desired. According to one embodiment, the stripping compositions are changed for each layer having a different composition.

EXAMPLES

The disclosure is further illustrated, without limitation, by the following examples. All percentages given are by weight unless otherwise specified. In these examples, the measurement of performance and selectivity of the present disclosure is conducted using practices readily accepted by the industry. In such cases, measurement is made by optical microscope and where necessary, the use of etch rate determinations by high sensitivity gravimetric reviews on metallic substrates, and where necessary, more detailed studies were conducted using scanning electron microscopy (SEM). In the following examples, silicon wafers were used as the inorganic substrate upon which the organic substance is applied and cured. The following items in Table 1 represent the organic substances to be removed, their preparation methods, and the sources from which they were procured.

TABLE 1

List of Organic Resins Used to Demonstrate the Disclosure.

| Example # | Material | Form | Type | Description/Manufacturer |
|---|---|---|---|---|
| 1 | Phost | Solid resin worked up as liquid | Amorphous, positive | Equal quantities as 1:1 w/wwt % PB5 and PB5W resin (Hydrite Chemical Co., Brookfield WI), dissolved in PGMEA* as 20 wt % solids |
| 2 | Novolac | Solid resin worked up as liquid | Amorphous, positive | Equal quantities as 1:1 w/wwt % REZICURE 5200 and 3100 (SI Group, Schenectady, NY), dissolved in PGMEA* as 20 wt % solids |
| 3 | Acrylic | Dry-film | Thermoset, negative | Shipley GA-series (GA-20) removed and applied direct, (Rhom & Haas, Inc. Marlborough, MA) |
| 4 | Polyimide | Liquid | Thermoset, Non-photoactive | PI-2611 (HD Microsystems, Parlin, NJ) |
| 5 | Isoprene | Liquid | Thermoset, negative | SC-RESIST (Fujifilm Electronic Materials, North Kingston, RI) |

*PGMEA: propylene glycol monomethyl ether acetate

Where applicable, the organic substance was applied in the manner of a coating using a Brewer Science, Inc. CB-100 coater and following standard protocol for applying the liquid form of the polymer material to the inorganic substrate. Once the material was coated, it was sent to a soft bake step for a short 60 second hot plate bake at 100° C. For negative Acrylic resist, the material was exposed to ultraviolet light of a broadband type emitting at 365 nanometers and of a high exposure dose of 0.12 W/cm$^2$-sec, for an excessive period of 30 minutes. Following exposure, the wafer was post-exposure baked at a predetermined hard bake temperature and time depending on the resist. Once the wafer samples have been prepared, they are staged for experimentation. The experiments in Examples 2-5 were all conducted identical to each other using the same wafers and handling practices. Each wafer was staged in the work station where the disclosure may be demonstrated. Compositions of the disclosure are prepared ahead of time and also set aside. The inventive method was tested by applying the composition of interest to a portion of the wafer surface. The wafer was then immediately transferred to a hot plate that had been preset at the desired processing temperature. Once the wafer was set onto the hot plate, a digital timer was started. Once the pre-established time has expired, the wafer was removed and immediately rinsed with distilled, deionized, or demineralized water from a wash bottle. The rinsed wafer was observed and set aside to dry. Additional observations were taken and the results were recorded.

In Examples 1-7, introduction of the monomer was obtained by the addition of a premade stock solution. These stock solutions were comprised of a hydrophilic solvent (Component A) and a water soluble or water dispersible or water dissipatable monomer (Component B). The monomers chosen were selected from various multifunctional sulfomonomers containing at least one metal sulfonate group attached to an aromatic nucleus that are water soluble or water dispersible or water dissipatible determined to be at or greater than 0.5 weight percent concentration (i.e. monomer in water). Such monomers are well known to those skilled in the art and include such monomers as the lithium and sodium salts of diethylene glycol diesters of 5-sulfoisophthalic acid, ethylene glycol diesters of 5-sulfoisphthalic acid, alkyl diesters of 5-sulfoisophthalic acid, aryl diesters of 5-sulfoisophthalic acid, and 5-sulfoisophthalic acid. Other monomers include salts of phenolsulfonates, alkoxybenzenesulfonates, and aryloxybenzenesulfonates. The solvents chosen were ethylene glycol, diethylene glycol, triethylene glycol, propylene glycol, diethylene glycol methyl ether (Eastman DM SOLVENT), diethylene glycol ethyl ether (Eastman DE SOLVENT), diethylene glycol propyl ether (Eastman DP SOLVENT), diethylene glycol butyl ether (Eastman DB SOLVENT), ethylene glycol propyl ether (Eastman EP SOLVENT), and ethylene glycol butyl ether (Eastman EB SOLVENT). In a screening study, solutions were attempted for each of the monomer and solvent pairings at 10, 20, and 30 wt % solids. These stock solutions were prepared by adding the solvent to a round-bottomed flask with an agitator, condenser, and nitrogen source connected. The appropriate amount of the monomer was then added, and the mixture was heated with agitation until the solution was obtained.

The tables include description of the cleaning composition by weight percent of the components and the cleaning conditions employed to test effectiveness of the cleaning process. The term "Clean" means complete removal of photoresist resin by visual inspection, "Not Clean" means partial removal of photoresist resin by visual inspection, and "No Change" means no indication that photoresist resin was attacked under process conditions by visual inspection. Solutions of the sodium salt of the diethylene glycol diester of 5-sulfoisophthalic acid (I) in diethylene glycol (DEG) are used to illustrate the invention in the following examples. Example 3 illustrates the use of other 5-sulfoisophthalic monomers.

In Examples 9-14, introduction of the sulfopolyester was obtained by the addition of a premade stock solution. These stock solutions were comprised of a hydrophilic solvent (Component A) and a water soluble or water dispersible or water dissipatable polymer (Component B). The polymers chosen were various sulfopolyesters of different glass transition temperatures and viscosities of both the linear and branched varieties. Such polymers are well known to those skilled in the art and are available, for instance, from Eastman Chemical Company under the tradename of Eastman AQ POLYMERS. In particular, such sulfopolyesters can be dissolved, dispersed or otherwise dissipated in aqueous dispersions, preferably at temperatures of less than 80° C. The polyesters considered as candidates for the invention include, but are not limited to, Eastman AQ 38S POLYMER, Eastman AQ 48 ULTRA POLYMER, Eastman AQ 55S POLYMER, EastONE S85030 COPOLYESTER, Eastman ES-100 WATER-DISPERSIBLE POLYMER, Eastman AQ 1350 COPOLYESTER, and Eastman AQ 2350 COPOLYESTER. The solvents chosen were ethylene glycol, diethylene glycol, triethylene glycol, propylene glycol, diethylene glycol methyl ether (Eastman DM SOLVENT), diethylene glycol ethyl ether (Eastman DE SOLVENT), diethylene glycol propyl ether (Eastman DP SOLVENT), diethylene glycol butyl ether (Eastman DB SOLVENT), ethylene glycol propyl ether (Eastman EP SOLVENT), and ethylene glycol butyl ether (Eastman EB SOLVENT). In a screening study, solutions were attempted for each of the polymer and solvent pairings at 10, 20, and 30 wt % solids. In addition, solutions of Eastman AQ 38S POLYMER and Eastman AQ 48 ULTRA POLYMER each at 40 wt % solids were attempted in the four Diethylene glycol ether solvents. These stock solutions were prepared by adding the solvent to a round-bottomed flask with an agitator, condenser, and nitrogen source connected. The appropriate amount of the solid sulfopolyester was then added, and the mixture was heated with agitation until the solution was obtained. Depending on the polymer and solvent pairing and the solids loading, the solutions were heated to different temperatures for various times ranging from 90° C. for 30 minutes to 180° C. for 70 minutes. Table 2 below summarizes these stock solutions. "Suitable Solutions" are those in which the polyester dissolved readily under preparation conditions, remained soluble on cooling, and the solution was suitable for making a coating. "Bad Solutions" are those in which either the solids were insoluble in the solvents under the preparation conditions or the solution formed was unstable in the short term. "Disqualified Solutions" are those in which a solution of the same polymer and solvent paring had previously formed a bad solution at a lower solids loading. "Questionable Solutions" are those in which the solutions formed were either extremely viscous or exhibited signs of potential long-term instability, but might be of value for further study.

TABLE 2

Summary of Potential Stock Solutions

| Solution Status | AQ-38 | AQ-48 | AQ-55 | ES-100 | EastONE | AQ-1350 | AQ-2350 |
|---|---|---|---|---|---|---|---|
| Suitable Solutions | 20 | 21 | 3 | 1 | 1 | 18 | 6 |
| Questionable Solutions | 0 | 3 | 2 | 1 | 3 | 2 | 1 |
| Bad Solutions | 11 | 8 | 20 | 12 | 17 | 6 | 15 |
| Disqualified Solutions | 3 | 2 | 5 | 16 | 9 | 4 | 8 |
| Total Solutions | 34 | 34 | 30 | 30 | 30 | 30 | 30 |

Based on this screening study, eighty-two suitable and questionable solutions were tested on both Phost and Novolac coated wafers that had in both cases been cured at 150° C. for 15 minutes. In each case, a small amount of solution was applied to resin coated wafer, the wafer was immediately heated to 100° C. for 60 seconds, then immediately washed with a stream of water at ambient temperature. A simple visual observation was used to evaluate completeness of resin removal. Only those blends that were judged to exhibit excellent cleaning performance by visual examination were deemed as passing. Table 3 summarizes the results.

TABLE 3

Cleaning of Novolac (N) and Phost (P): (C—Cleaned; F—Failed)

| Wt % Solid | | 10% | | 20% | | 30% | | 40% | |
|---|---|---|---|---|---|---|---|---|---|
| Solvent | Sulfopolyester | P | N | P | N | P | N | P | N |
| Ethylene glycol | AQ-1350 | C | F | | | | | | |
| Ethylene glycol | AQ-38 | C | F | C | F | | | | |
| Ethylene glycol | AQ-48 | C | F | C | F | | | | |
| Ethylene glycol | AQ-55 | C | C | | | | | | |
| Ethylene glycol | EastONE | C | F | | | | | | |
| Ethylene glycol | ES-100 | C | F | | | | | | |
| Diethylene glycol | AQ-1350 | C | F | | | | | | |
| Diethylene glycol | AQ-38 | C | C | C | C | | | | |
| Diethylene glycol | AQ-48 | C | C | C | C | | | | |

TABLE 3-continued

Cleaning of Novolac (N) and Phost (P): (C—Cleaned; F—Failed)

| Wt % Solid | | 10% | | 20% | | 30% | | 40% | |
|---|---|---|---|---|---|---|---|---|---|
| Solvent | Sulfopolyester | P | N | P | N | P | N | P | N |
| Diethylene glycol | AQ-55 | C | C | | | | | | |
| Propylene glycol | AQ-48 | | | C | F | | | | |
| Propylene glycol | AQ-55 | | | C | F | | | | |
| DM Solvent | AQ-1350 | C | C | C | F | C | F | | |
| DM Solvent | AQ-2350 | C | C | C | F | F | F | | |
| DM Solvent | AQ-38 | C | C | C | F | C | F | F | F |
| DM Solvent | AQ-48 | C | C | C | C | C | F | C | F |
| DE Solvent | AQ-1350 | C | C | C | F | C | F | | |
| DE Solvent | AQ-2350 | C | F | C | F | C | F | | |
| DE Solvent | AQ-38 | C | C | C | C | F | F | C | F |
| DE Solvent | AQ-48 | C | C | C | C | C | F | C | C |
| DP Solvent | AQ-1350 | C | C | C | F | C | C | | |
| DP Solvent | AQ-38 | F | F | C | C | C | C | C | C |
| DP Solvent | AQ-48 | C | C | C | C | C | F | F | F |
| DB Solvent | AQ-1350 | C | C | C | F | C | F | | |
| DB Solvent | AQ-38 | | | C | F | C | C | C | F |
| DB Solvent | AQ-48 | | | C | C | C | C | F | F |
| EP Solvent | AQ-1350 | C | F | C | F | C | C | | |
| EB Solvent | AQ-1350 | C | C | C | F | C | C | | |

The composition comprising diethylene glycol ethyl ether and Eastman AQ 48 ULTRA POLYMER at solids loadings ranging from 10 wt % all the way up to 40 wt % were found to exhibit broad performance cleaning both Phost and Novolac photoresist resin from silicon substrate. In addition, the various concentrations of these solutions were extremely stable even after several months of storage at room temperature.

Therefore, a composition comprising 20 wt % Eastman AQ 48 and 80 wt % diethylene glycol ethyl ether (Eastman DE SOLVENT) was selected as the suitable standard composition to be used in developing additive blends to target more exotic and more difficult to remove photoresists. This stock solution comprised 30% of the final solutions used to treat wafers in Examples 10-14, yielding 6 wt % sulfopolyester and 24 wt % DE SOLVENT in all of these solutions. Thus, examples 10-14 are to demonstrate how one skilled in the art may approach development of a composition according to this invention that is suitable for removal of an organic residue. Neither the selection of this standard composition for further studies nor the specific examples that follow are intended to limit the scope of this invention.

Example 1

Table 4 contains the results from a cleaning study conducted for Novolac resin coated as described in Table 1. Resin was cured for 15 minutes at 200° C. Process temperatures for the cleaning stage were 100° C., 150° C., and 200° C.

TABLE 4

| Solution (wt %) | | | Process Conditions | | | |
|---|---|---|---|---|---|---|
| I | DEG | DE Solvent | 150° C. for 60 s | 150° C. for 90 s | 200° C. for 30 s | 200° C. for 60 s |
| 29.64% | 70.36% | 0.00% | Not Clean | Clean | Not Clean | Clean |
| 15.96% | 84.04% | 0.00% | Not Clean | Clean | Not Clean | Not Clean |
| 25.08% | 74.92% | 0.00% | Clean | Clean | Clean | Clean |

TABLE 4-continued

| Solution (wt %) | | | Process Conditions | | | |
|---|---|---|---|---|---|---|
| I | DEG | DE Solvent | 150° C. for 60 s | 150° C. for 90 s | 200° C. for 30 s | 200° C. for 60 s |
| 15.96% | 38.04% | 46.00% | Not Clean | Clean | Not Clean | Not Clean |
| 25.08% | 59.92% | 15.00% | Not Clean | Clean | Not Clean | Not Clean |

I—Sodium salt of the diethylene glycol diester of 5-sulfoisophthalic acid
DEG—Diethylene glycol
DE Solvent—Diethylene glycol ethyl ether Example 2

Table 5 contains the results from a cleaning study conducted for Phost resin coated as described in Table 1. Resin was cured for 15 minutes at 200° C. All cleaning compositions are comprised of 6 wt % sulfopolyester, 24 wt % DE Solvent, with the remaining 70 wt % being comprised of two additives as noted in Table 6. Process temperatures for the cleaning stage were 100° C., 150° C., and 200° C.

TABLE 5

| Solution (wt %) | | | Process Conditions | | |
|---|---|---|---|---|---|
| I | DEG | DE Solvent | 100° C. for 30 s | 100° C. for 60 s | 150° C. for 60 s |
| 29.64% | 70.36% | 0.00% | Clean | Clean | Clean |
| 15.96% | 84.04% | 0.00% | Clean | Clean | Clean |
| 25.08% | 74.92% | 0.00% | Clean | Clean | Clean |
| 15.96% | 38.04% | 46.00% | Clean | Clean | Clean |
| 25.08% | 59.92% | 15.00% | Clean | Clean | Clean |

I - Sodium salt of the diethylene glycol diester of 5-sulfoisophthalic acid
DEG - Diethylene glycol
DE Solvent - Diethylene glycol ethyl ether Examples 1 and 2 demonstrate the utility of invention in cleaning cured Novolac and polyhydroxystyrene resins from silica wafers. In the case of polyhydroxystyrene resin (Example 2), all cleaning compositions were effective in removing cured resin using cleaning conditions of 100-150° C. from 30 seconds to 60 seconds. For Novolac resins (Example 1), cleaning required process temperatures greater than 100° C. to achieve satisfactory removal of resin although some removal is noted under all reported conditions. In both examples, it was found resins could be removed by compositions containing DE solvent. Addition of such solvent could benefit the management of viscosity as needed to utilize the invention in various coating process steps.

Example 3

Table 6 contains the results from a cleaning study conducted to test compositions containing 20 weight percent 5-sodiosulfoisophthalic acid (SSIPA), 5-lithiosulfoisophthalic acid (LiSIPA), the ethylene glycol diester of 5-sodiosulfoisophthalic acid (EGSIPA diester), and the diethylene glycol ethyl ether diester of 5-sodiosulfoisophthalic acid (DESIPA diester) as cleaning compositions to remove Novolac and polyhydroxystyrene resins. Resins were cured for 15 minutes at 200° C. Process temperatures for the cleaning stage were 100° C. for 60 seconds.

TABLE 6

| Monomer | Wt % Monomer | Solvent | Novolac | Phost |
|---|---|---|---|---|
| SSIPA | 20 | Diethylene glycol | No Change | No Change |
| LiSIPA | 20 | Diethylene glycol | Not Clean | Clean |
| EGSIPA diester | 20 | ethylene glycol | No Change | Clean |
| DESIPA diester | 20 | Diethylene glycol ethyl ether | Not Clean | Clean |

The data in Table 6 indicates compositions of ethylene glycol, diethylene glycol and diethylene glycol ethers containing lower molecular weight monomeric salts of 5-sulfosulfonic acid and related esters perform well as cleaning compositions to Phost resin, but little success cleaning Novolac resin.

Example 4

Table 7 contains the results from a cleaning study conducted for polyimide resin coated as described in Table 1. Resin was cured for 15 minutes at 150° C. Process temperatures for the cleaning stage were 100° C., 150° C., and 200° C. at various durations of time. Results are tabulated below.

TABLE 7

| | Solution (wt %) | | | | | Process Conditions | | |
|---|---|---|---|---|---|---|---|---|
| I | DEG | DE Solvent | 2-Pyrolle | MEA | KTB | 150° C. for 90 s | 200° C. for 30 s | 200° C. for 60 s |
| 8.89% | 21.11% | 0.00% | 28.00% | 35.00% | 7.00% | No Change | Not Clean | Not Clean |
| 4.79% | 25.21% | 0.00% | 28.00% | 35.00% | 7.00% | No Change | Not Clean | Clean |
| 7.52% | 22.48% | 0.00% | 28.00% | 35.00% | 7.00% | No Change | Clean | Not Clean |
| 4.79% | 11.41% | 13.80% | 28.00% | 35.00% | 7.00% | No Change | Not Clean | Not Clean |
| 7.52% | 17.98% | 4.50% | 28.00% | 35.00% | 7.00% | No Change | No Change | Not Clean |

I—Sodium salt of the diethylene glycol diester of 5-sulfoisophthalic acid
DEG—Diethylene glycol
DE Solvent—Diethylene glycol ethyl ether
MEA—monoethanolamine
KTB—potassium tert-butoxide Example 4 suggests that cured polyimide resin is more difficult to clean than either Phost or Novolac resin. Only the use of highly basic materials such as 2-pyrolle, MEA and KTB in the additive component produced desirable results on low temperature cleaned wafers. No evidence of attack is noted unless the temperature of the cleaning process is elevated to 200° C.

Example 5

Table 8 contains the results from a cleaning study conducted for acrylic resin coated as described in Table 1. Resin was cured for 15 minutes at 150° C. Process temperatures for the cleaning stage were 100° C., 150° C., and 200° C. Results are tabulated below.

TABLE 8

| | Solution (wt %) | | | | | Process Conditions | | |
|---|---|---|---|---|---|---|---|---|
| I | DEG | DE Solvent | 2-Pyrolle | MEA | KTB | 150° C. for 90 s | 200° C. for 30 s | 200° C. for 60 s |
| 8.89% | 21.11% | 0.00% | 28.00% | 35.00% | 7.00% | No Change | Not Clean | Not Clean |
| 4.79% | 25.21% | 0.00% | 28.00% | 35.00% | 7.00% | No Change | Not Clean | Clean |
| 7.52% | 22.48% | 0.00% | 28.00% | 35.00% | 7.00% | No Change | Clean | Not Clean |
| 4.79% | 11.41% | 13.80% | 28.00% | 35.00% | 7.00% | No Change | Not Clean | Not Clean |
| 7.52% | 17.98% | 4.50% | 28.00% | 35.00% | 7.00% | No Change | No Change | Not Clean |

I—Sodium salt of the diethylene glycol diester of 5-sulfoisophthalic acid
DEG—Diethylene glycol
DE Solvent—Diethylene glycol ethyl ether
MEA—monoethanolamine
KTB—potassium tert-butoxide Example 5 suggests that cured acrylic resin is more difficult to clean than either Phost or Novolac resin but requires conditions similar to polyimide resin for satisfactory removal of resin.

Example 6

Table 9 contains the results from a cleaning study conducted for Isoprene resin coated as described in Table 1. Wafers were cured for 15 minutes at 150° C. Process temperatures for the cleaning stage were 100° C., 150° C., and 200° C.

TABLE 9

| Solution (wt %) | | | | Process Conditions | | | |
|---|---|---|---|---|---|---|---|
| Solids | DEG | Aromatic-100 | DDBSA | 100° C. for 60 s | 100° C. for 90 s | 150° C. for 60 s | 150° C. for 90 s |
| 2.74% | 3.27% | 56.40% | 37.60% | Some Clean | Clean | Clean | Clean |
| 6.84% | 8.17% | 51.00% | 34.00% | Some Clean | Clean | Clean | Clean |
| 9.12% | 10.89% | 48.00% | 32.00% | Some Clean | Clean | Clean | Clean |

I—Sodium salt of the diethylene glycol diester of 5-sulfoisophthalic acid
DEG—Diethylene glycol
DE Solvent—Diethylene glycol ethyl ether The cleaning compositions presented in Example 6 were designed to be hydrophobic (hydrocarbon) to allow penetration of the cleaning composition into the resin.

Example 7

To further illustrate a method of the disclosure, wafers having a cured photoresist layer as described above were coated with formulations described in art as useful for removing photoresist by a known bath or soaking dissolution process.

Formulations were prepared according to Table 10 and applied to isoprene coated wafer pieces cured 15 minutes at 150° C. per Table 1. The wafer pieces were immediately heated to the target temperature for 60 seconds, and rinsed with water. The effectiveness of photoresist removal was judged by visual inspection.

TABLE 10

Cleaning Results for Isoprene Resin

| Additive A | Additive B | Additive A:B wt % Concentrations | 95° C. | 125° C. | 150° C. |
|---|---|---|---|---|---|
| [1]Aromatic 100 Fluid | [2]DDBSA | 50:50 | Partial Clean | Not Clean | Partial Clean |
| [1]Aromatic 150 Fluid | [2]DDBSA | 50:50 | Partial Clean | Partial Clean | Clean |
| [1]Aromatic 200 Fluid | [2]DDBSA | 50:50 | Clean | Partial Clean | Partial Clean |

[1]Aromatic 100 Fluid, Aromatic 150 Fluid and Aromatic 200 Fluid from ExxonMobil Chemical
[2]DDBSA—dodecylbenzenesulfonic acid Example 8

Formulations were prepared according to Table 11 and applied to acrylic coated wafer pieces cured 15 minutes at 150° C. per Table 1. The wafer pieces were immediately heated to the target temperature for 60 seconds, and rinsed with water. The effectiveness of photoresist removal was judged by visual inspection.

TABLE 11

Cleaning Results for Acrylic Resin

| Additive A (%) | Additive B (%) | Additive C (%) | Additive D (%) | 95° C. | 125° C. | 150° C. |
|---|---|---|---|---|---|---|
| [1]DGA(60) | [2]HA(40) | — | — | Partial Clean | Partial Clean | Clean |
| [3]MEA (60) | HA (40) | — | — | Clean | No Clean | No Clean |
| [4]AEEA (60) | HA (30) | Water (10) | — | Partial Clean | Partial Clean | Partial Clean |
| AEEA(35) | MEA(25) | HA(30) | Water (10) | Partial Clean | Partial Clean | Partial Clean |
| DGA (40) | [5]NMP(20) | HA(40) | — | Clean | Partial Clean | Partial Clean |
| MEA (40) | NMP(20) | HA(40) | — | Partial Clean | Partial Clean | Partial Clean |
| AEEA(40) | NMP(20) | HA(30) | Water (10) | Clean | Partial Clean | No Clean |
| AEEA(25) | MEA(15) | NMP(20) | HA(40) | No Clean | No Clean | No Clean |
| DGA (40) | [6]DMAC(20) | HA(40) | — | Clean | Clean | Clean |
| MEA (40) | DMAC(20) | HA(40) | — | Clean | Partial Clean | Clean |
| AEEA(40) | DMAC(20) | HA(30) | Water (10) | Partial Clean | No Clean | No Clean |
| AEEA(25) | MEA(15) | DMAC(20) | HA(40) | Clean | No Clean | No Clean |
| [7]DMSO(70) | HA(30) | — | — | Clean | Partial Clean | Partial Clean |
| DMSO(86) | [8]DEGEE(6) | AEEA | [9]TMAH | Clean | Clean | Partial Clean |

TABLE 11-continued

Cleaning Results for Acrylic Resin

| Additive A (%) | Additive B (%) | Additive C (%) | Additive D (%) | 95° C. | 125° C. | 150° C. |
|---|---|---|---|---|---|---|
| DMSO(88) | MEA(6) | TMAH(6) | | Partial Clean | Partial Clean | Partial Clean |

[1]DGA—diglycolamine
[2]HA—50% hydroxylamine in water
[3]MEA—monoethanolamine
[4]AEEA—N-(2-aminoethyl)ethanolamine
[5]NMP—N-methyl 2-pyrrolidinone
[6]DMAC—N,N-dimethyl acetamide
[7]DMSO—dimethylsulfoxide
[8]DEGEE—Diethylene glycol ethyl ether
[9]TMAH—tetramethylammonium hydroxide The data contained in Tables 10 and 11 indicate many different formulations may be used to effect photoresist removal according to the method of the invention. It should be noted that high temperatures may cause the formation of a water insoluble haze or crust in some cases. This can be mitigated by temperature optimization.

Example 9

In contrast with the over-all success of many compositions containing a sulfonated polyester, compositions containing other water soluble, dispersible, or dissipatable polymers did not perform nearly as well. In general, these other polymers were far less soluble in the chosen solvents. Process conditions for achieving the solutions again varied depending on the polymer and solvent pairing and the solids loading. In most cases, the solutions were heated to a temperature ranging from 120° C. for 30 minutes up to 180° C. for 80 minutes; however, the polyvinyl pyrrolidone and the dendritic polyester were both noticeable exceptions that required far less heating. The results of the solubility study are tabulated below.

TABLE 12

Summary of Stock Solutions Not Containing a Sulfonated Polyester

| Solution Status | [1]DPE | [2]AMP | [3]PVP | [4]SPS | [5]HEC | [6]XSS | [7]PVME | [8]CAP |
|---|---|---|---|---|---|---|---|---|
| Suitable Solutions | 0 | 1 | 40 | 0 | 0 | 0 | 10 | 8 |
| Questionable Solutions | 26 | 0 | 0 | 0 | 0 | 6 | 0 | 13 |
| Bad Solutions | 0 | 10 | 0 | 11 | 10 | 4 | 2 | 3 |
| Disqualified Solutions | 4 | 19 | 0 | 19 | 20 | 20 | 18 | 6 |
| Total Solutions | 30 | 30 | 40 | 30 | 30 | 30 | 30 | 30 |

[1]DPE—Dendritic Polyester
[2]AMP—Sulfonated acrylic
[3]PVP—Polyvinyl pyrrolidone
[4]SPS—Sulfonated polystyrene
[5]HEC—Hydroxyethyl Cellulose
[6]XSS—Xylene sodium sulfonate
[7]PVME—Polyvinyl methyl ether
[8]CAP—Cellulose acetate phthalate From the suitable and questionable blends prepared, a selection of 49 was tested on both PHOST and Novolac photoresist that had been cured at 150° C. for 15 minutes. In both cases, a small amount of each composition was applied to the resin coated wafer, heated to 100° C. for 60 seconds, and then immediately rinsed off with de-ionized water at ambient temperature. A simple visual inspection was subsequently made, and only those compositions judged to have excellent cleaning performance were deemed as passing. In many cases, only the 10 wt % solids blends were tested; however, solutions with up to 40 wt % solids of the polyvinyl pyrollidone were also tested because that particular polymer was so soluble in every solvent tested. With the exception of xylene sodium sulfonate, the results were almost wholly negative, and further testing was deemed unnecessary. The results of the performance screening are summarized below.

TABLE 13

Cleaning of Novolac (N) and PHOST (P):
(C—Cleaned; F—Failed)

| Wt % Solids | | 10% | | 20% | | 30% | | 40% | |
|---|---|---|---|---|---|---|---|---|---|
| Solvent | Polymer | P | N | P | N | P | N | P | N |
| Ethylene glycol | [1]AMP | C | F | | | | | | |
| Ethylene glycol | [2]PVP | F | F | | | | | F | F |
| Diethylene glycol | [3]DPE | C | F | | | | | | |
| Diethylene glycol | PVP | F | F | | | | | F | F |
| Diethylene glycol | [4]XSS | C | C | | | | | | |
| Diethylene glycol | [5]CAP | C | F | | | | | | |
| Triethylene glycol | PVP | F | F | | | | | F | F |
| Triethylene glycol | XSS | C | F | | | | | | |
| Triethylene glycol | CAP | C | F | | | | | | |
| Propylene glycol | PVP | F | F | | | | | F | F |
| Propylene glycol | XSS | C | C | | | | | | |
| DM Solvent | PVP | F | F | | | | | F | F |
| DM Solvent | XSS | C | C | | | | | | |
| DM Solvent | [6]PVME | F | F | F | F | F | F | | |
| DM Solvent | CAP | F | F | C | F | | | | |
| DE Solvent | DPE | C | F | | | | | | |
| DE Solvent | PVP | F | F | | | | | F | F |
| DE Solvent | XSS | C | C | | | | | | |
| DE Solvent | PVME | F | F | F | F | F | F | | |
| DE Solvent | CAP | F | F | | | | | | |
| DP Solvent | DPE | F | F | | | | | | |
| DP Solvent | PVP | F | F | | | | | F | F |
| DP Solvent | XSS | C | F | | | | | | |
| DP Solvent | PVME | C | F | F | F | | | | |

TABLE 13-continued

Cleaning of Novolac (N) and PHOST (P):
(C—Cleaned; F—Failed)

| Wt % Solids | | 10% | | 20% | | 30% | | 40% | |
|---|---|---|---|---|---|---|---|---|---|
| Solvent | Polymer | P | N | P | N | P | N | P | N |
| DP Solvent | CAP | F | F | | | | | | |
| DB Solvent | PVP | F | F | | | | | F | F |
| DB Solvent | PVME | C | F | C | F | | | | |
| DB Solvent | CAP | F | F | | | | | | |
| EP Solvent | DPE | F | F | | | | | | |
| EP Solvent | PVP | F | F | | | | | F | F |
| EP Solvent | CAP | F | F | | | | | | |
| EB Solvent | PVP | F | F | | | | | F | F |

[1]AMP—Sulfonated acrylic
[2]PVP—Polyvinyl pyrollidone
[3]DPE—Dendritic Polyester
[4]XSS—Xylene sodium sulfonate
[5]CAP—Cellulose acetate phthalate
[6]PVME—Polyvinyl methyl ether Very few solutions exhibited success in cleaning both PHOST and Novolac photoresist, and the few compositions that did have this success were questionable solutions that were non-ideal for use in this invention. By comparison, many compositions containing sulfonated polyesters exhibited much better performance dissolving PHOST and Novolac photoresist. The compositions containing sulfonated polyesters were significantly preferable to those containing any of the other polymers considered, and a single composition from those containing sulfonated polyesters was chosen for future testing.

Example 10

Table 12 contains the results from a cleaning study conducted for PHost resin coated as described in Table 1. Resin was cured for 15 minutes at 200° C. All cleaning compositions are comprised of 6 wt % sulfopolyester, 24 wt % DE SOLVENT, with the remaining 70 wt % being comprised of two additives as noted in Table 14. Process temperatures for the cleaning stage were 100° C., 150° C., and 200° C.

TABLE 14

Cleaning Results for PHost Resin

| Additive A | Additive B | Additive A:B wt % Concentrations | 100° C. | 150° C. | 200° C. |
|---|---|---|---|---|---|
| [1]NMP | [2]TMAH | 65:5 | Clean | Clean | Clean |
| NMP | TMAH | 50:20 | Clean | Clean | Clean |
| NMP | [3]KTB | 65:5 | Clean | Clean | Clean |
| NMP | KTB | 50:20 | Clean | Clean | Clean |
| NMP | [4]MEA | 65:5 | Clean | Not Clean | Not Clean |
| NMP | MEA | 50:20 | Clean | Clean | Not Clean |
| NMP | H$_3$PO$_4$ | 65:5 | Clean | Clean | Not Clean |
| NMP | H$_3$PO$_4$ | 50:20 | Clean | Clean | Clean |
| NMP | [5]MSA | 65:5 | Clean | Clean | Clean, some |
| NMP | MSA | 50:20 | Clean | Clean | Clean |
| [6]DMSO | TMAH | 65:5 | Clean | Clean | Clean |
| DMSO | TMAH | 50:20 | Clean | Clean | Clean |
| DMSO | KTB | 65:5 | Clean | Clean | Clean |
| DMSO | KTB | 50:20 | Clean | Clean | Clean |
| DMSO | MEA | 65:5 | Clean | Clean, most | Not Clean |
| DMSO | MEA | 50:20 | Clean | Clean | Not Clean |
| DMSO | H$_3$PO$_4$ | 65:5 | Clean | Clean, most | Clean |
| DMSO | H$_3$PO$_4$ | 50:20 | Clean | Clean | Clean |
| DMSO | MSA | 65:5 | Clean | Clean | Not Clean |
| DMSO | MSA | 50:20 | Clean | Clean | Clean |

[1]NMP—N-methyl-2-pyrrolidone
[2]TMAH—Tetramethylammonium hydroxide (20 wt % in propylene glycol)
[3]KTB—Potassium tert-butoxide (20 wt % in propylene glycol)
[4]MEA—Monoethanol mine
[5]MSA—Methanesulfonic acid
[6]DMSO—Dimethylsulfoxide The data in Table 12 suggest that most solutions will perform well in dissolving and removing the PHost resin, even at high exposure temperatures of 200° C. The solutions enriched with higher concentrations of acid or base additives exhibited improved results. At both levels of enrichment, solutions containing MEA did not perform well removing PHost cured at high temperatures. The primary conclusion here is that PHost is relatively easy to process at 60 seconds with the invention method and compositions.

Example 11

Table 13 contains the results from a cleaning study conducted for Novolac resin coated as described in Table 1. Resin was cured for 15 minutes at 200° C. All cleaning compositions were comprised of 6 wt % sulfopolyester, 24 wt % DE Solvent, with the remaining 70 wt % being comprised of two additives as noted in Table 15. Process temperatures for the cleaning stage were 100° C., 150° C., and 200° C.

TABLE 15

Cleaning Results for Novolac Resin

| Additive A | Additive B | Additive A:B wt % Concentrations | 100° C. | 150° C. | 200° C. |
|---|---|---|---|---|---|
| [1]NMP | [2]TMAH | 65:5 | Clean | Not Clean | Clean |
| NMP | TMAH | 50:20 | Not Clean | Clean | Clean |
| NMP | [3]KTB | 65:5 | Clean | Clean | Not Clean |
| NMP | KTB | 50:20 | Clean | Clean | Clean |
| NMP | [4]MEA | 65:5 | Clean | Clean | Not Clean |
| NMP | MEA | 50:20 | Clean | Clean | Not Clean |
| NMP | H$_3$PO$_4$ | 65:5 | Not Clean | Clean | Not Clean |
| NMP | H$_3$PO$_4$ | 50:20 | Not Clean | Clean | Clean |
| NMP | [5]MSA | 65:5 | Clean | Clean | Not Clean |
| NMP | MSA | 50:20 | Clean | Clean | Clean |
| [6]DMSO | TMAH | 65:5 | Clean | Clean | Clean |
| DMSO | TMAH | 50:20 | Clean | Clean | Clean |
| DMSO | KTB | 65:5 | Clean | Clean | Clean |
| DMSO | KTB | 50:20 | Clean | Clean | Clean |
| DMSO | MEA | 65:5 | Clean | Not Clean | Not Clean |

TABLE 15-continued

Cleaning Results for Novolac Resin

| Additive A | Additive B | Additive A:B wt % Concentrations | 100° C. | 150° C. | 200° C. |
|---|---|---|---|---|---|
| DMSO | MEA | 50:20 | Clean | Clean | Not Clean |
| DMSO | $H_3PO_4$ | 65:5 | Not Clean | Clean | Not Clean |
| DMSO | $H_3PO_4$ | 50:20 | Not Clean | Not Clean | Not Clean |
| DMSO | MSA | 65:5 | Clean | Not Clean | Not Clean |
| DMSO | MSA | 50:20 | Clean | Clean | Not Clean |

[1]NMP—N-methyl-2-pyrrolidone
[2]TMAH—Tetramethylammonium hydroxide (20 wt % in propylene glycol)
[3]KTB—Potassium tert-butoxide (20 wt % in propylene glycol)
[4]MEA—Monoethanol amine
[5]MSA—Methanesulfonic acid
[6]DMSO—Dimethylsulfoxide Table 13 suggests that most additive combinations are suitable for cleaning cured Novolac resin from silica substrates; however, some difficulty is encountered when cleaning at 200° C. Acidic solutions do not produce desirable results especially on highly cured novolac resin, with phosphoric acid containing compositions failing in nearly every attempt.

Example 12

Table 14 contains the results from a cleaning study conducted for acrylic resin coated as described in Table 1. Resin was cured for 15 minutes at 150° C. All cleaning compositions were comprised of 6 wt % sulfopolyester, 24 wt % DE Solvent, with the remaining 70 wt % being comprised of two additives as noted in Table 16. Process temperatures for the cleaning stage were 100° C., 150° C., and 200° C. Results are tabulated below.

TABLE 16

Cleaning Results for Acrylic Resin

| Additive A | Additive B | Additive A:B wt % Concentrations | 100° C. | 150° C. | 200° C. |
|---|---|---|---|---|---|
| [1]NMP | [2]TMAH | 65:5 | Clean | Partial Clean | Partial Clean |
| NMP | TMAH | 50:20 | Clean | Partial Clean | Clean |
| NMP | [3]KTB | 65:5 | Clean | Partial Clean | Partial Clean |
| NMP | KTB | 50:20 | Clean | Clean | Partial Clean |
| NMP | [4]MEA | 65:5 | Clean | Partial Clean | Partial Clean |
| NMP | MEA | 50:20 | Partial Clean | Partial Clean | Partial Clean |
| NMP | $H_3PO_4$ | 65:5 | Partial Clean | Partial Clean | Partial Clean |
| NMP | $H_3PO_4$ | 50:20 | Partial Clean | Partial Clean | No Clean |
| NMP | [5]MSA | 65:5 | Partial Clean | Partial Clean | Partial Clean |
| NMP | MSA | 50:20 | Partial Clean | Partial Clean | Partial Clean |
| [6]DMSO | TMAH | 65:5 | Clean | Partial Clean | Partial Clean |
| DMSO | TMAH | 50:20 | Clean | Partial Clean | Clean |

TABLE 16-continued

Cleaning Results for Acrylic Resin

| Additive A | Additive B | Additive A:B wt % Concentrations | 100° C. | 150° C. | 200° C. |
|---|---|---|---|---|---|
| DMSO | KTB | 65:5 | Clean | Partial Clean | Partial Clean |
| DMSO | KTB | 50:20 | Partial Clean | Partial Clean | Partial Clean |
| DMSO | MEA | 65:5 | Clean | Partial Clean | Partial Clean |
| DMSO | MEA | 50:20 | Clean | Partial Clean | Partial Clean |
| DMSO | $H_3PO_4$ | 65:5 | Partial Clean | Partial Clean | Partial Clean |
| DMSO | $H_3PO_4$ | 50:20 | Not Clean | Not Clean | Not Clean |
| DMSO | MSA | 65:5 | Partial Clean | Partial Clean | Partial Clean |
| DMSO | MSA | 50:20 | Partial Clean | Partial Clean | Partial Clean |

[1]NMP—N-methyl-2-pyrrolidone
[2]TMAH—Tetramethylammonium hydroxide (20 wt % in propylene glycol)
[3]KTB—Potassium tert-butoxide (20 wt % in propylene glycol)
[4]MEA—Monoethanol amine
[5]MSA—Methanesulfonic acid
[6]DMSO—Dimethylsulfoxide Table 14 suggests that cured acrylic resin is more difficult to clean than either PHOST or novolac resin. Only the use of highly basic materials such as TMAH, MEA, or KTB in the additive component produced desirable results on low temperature cleaned wafers.

Example 13

Table 15 contains the results from a cleaning study conducted for Polyimide resin coated as described in Table 1. After the soft bake, wafers were cured for 15 minutes at 200° C. followed by an additional 30 minutes at 350° C. All cleaning compositions were comprised of 6 wt % sulfopolyester, 24 wt % DE Solvent, with the remaining 70 wt % being comprised of three additives as noted in Table 17. Process temperatures for the cleaning stage were 100° C., 150° C., and 200° C. Results are tabulated below.

TABLE 17

Cleaning Results for Polyimide Resin

| Additive A | Additive B | Additive C | Additive A:B:C wt % Concentrations | 100° C. | 150° C. | 200° C. |
|---|---|---|---|---|---|---|
| [1]NMP | DMSO | MEA | 23.5:23.5:23 | Not clean | Not clean | Not clean |
| NMP | DMSO | [3]KTB | 23.5:23.5:23 | Not clean | Clean | Clean |
| NMP | DMSO | [2]TMAH | 23.5:23.5:23 | Not clean | Clean | Clean |
| NMP | [5]Surf | [4]MEA | 46:2:22 | Not clean | Not clean | Not clean |
| NMP | Surf | KTB | 46:2:22 | Not clean | Clean | Clean |
| NMP | Surf | TMAH | 46:2:22 | Clean | Clean | Clean |
| DMSO | None | MEA | 47:23 | Not clean | Not clean | Not clean |
| DMSO | None | KTB | 47:23 | Not clean | Not clean | Clean |
| DMSO | None | TMAH | 47:23 | Not clean | Clean | Clean |
| DMSO | Surf | MEA | 46:2:22 | Not clean | Not clean | Not clean |

TABLE 17-continued

Cleaning Results for Polyimide Resin

| Additive A | Additive B | Additive C | Additive A:B:C wt % Concentrations | 100° C. | 150° C. | 200° C. |
|---|---|---|---|---|---|---|
| DMSO | Surf | KTB | 46:2:22 | Not clean | Clean | Clean |
| DMSO | Surf | TMAH | 46:2:22 | Not clean | Clean | Clean |
| DMSO | [7]DMSO$_2$ | [8]KTB + MEA | 27.5:23.5:23 | Not clean | Clean | Clean |
| NMP | DMSO | [8]KTB + MEA | 27.5:23.5:23 | Not clean | Clean | Clean |

[1]NMP—N-methyl-2-pyrrolidone
[2]TMAH—Tetramethylammonium hydroxide (20 wt % in propylene glycol)
[3]KTB—Potassium tert-butoxide (20 wt % in propylene glycol)
[4]MEA—Monoethanol amine
[5]Surf—Nonionic alkyl polyethylene glycol ether surfactant
[6]DMSO—Dimethylsulfoxide
[7]DMSO$_2$—Dimethylsulfone
[8]KTB + MEA—equal weights of 20 wt % potassium t-butoxide in propylene glycol and monoethanol amine Table 15 suggests that higher process temperatures yield best results for cleaning polyimide resin from inorganic substrates. Virtually no good results were observed at a process temperature of 100° C. Additionally, polyimide removal required a strong alkali component with a pKa equal to or greater than 12. In all instances where MEA is present alone in the composition as the only alkali, cleaning results were not acceptable. The presence of KTB or TMAH did promote good results.

Example 14

Table 16 contains the results from a cleaning study conducted for Isoprene resin coated as described in Table 1. Wafers were cured for 15 minutes at 150° C. All cleaning compositions were comprised of 6 wt % sulfopolyester, 24 wt % DE Solvent, with 68 wt % being comprised of two additives as noted in Table 15 and 2 wt % being comprised of a surfactant such as Zelec™ UN (alkoxyphosphate ester surfactant). Process temperatures for the cleaning stage were 100° C., 150° C., and 200° C.

TABLE 18

Cleaning Results for Isoprene Resin

| Additive A | Additive B | Additive A:B wt % Concentrations | 100° C. | 150° C. | 200° C. |
|---|---|---|---|---|---|
| [1]Aromatic 150 Fluid | [2]DDBSA | 41:27 | Not Clean | Clean | Clean |
| 1-Dodecene | DDBSA | 41:27 | Not Clean | Clean | Clean |

[1]Aromatic 150 Fluid from ExxonMobil Chemical
[2]DDBSA—dodecylbenzenesulfonic acid The cleaning composition presented in Table 18 was designed to be significantly hydrophobic (hydrocarbon) to allow penetration of the cleaning composition into the resin. The compositions shown here represent a key condition that is necessary to affect proper performance. Elevated temperatures were found necessary to adequately remove the rubber-like isoprene photoresist from the inorganic substrate in 60 seconds.

What is claimed is:

1. A single-stage process for removing a substance from a substrate comprising,
   (a) coating the substance with a stripping composition to a thickness of 1000 microns or less wherein said stripping composition comprises;
      i. at least one organic solvent at weight percent ranging from 0.5% to 99.5%;
   (b) heating the substrate to a temperature and for a time sufficient to release the substance; and
   (c) rinsing the substrate with a volume of a rinsing agent sufficient to remove the composition and the substance;
   wherein the process is a single-stage process comprising (a), (b), and (c).

2. The process of claim 1, wherein the thickness of the stripping composition is 800 microns or less.

3. The process of claim 2, wherein the thickness of the stripping composition is 600 microns or less.

4. The process of claim 3, wherein the thickness of the stripping composition is 400 microns or less.

5. The process of claim 1, wherein the single-stage process is carried out in a single bowl.

6. The process of claim 1, wherein the substrate is preheated before coating with the stripping composition.

7. The process of claim 1, wherein the stripping composition is preheated before it is coated on the substrate.

8. The process of claim 1, wherein the substrate is subjected to a second cycle of coating, heating, and rinsing.

9. The process of claim 8, wherein the stripping composition used in second cycle is different from the stripping composition used in the first cycle.

10. The process of claim 1, further comprising drying the substrate after rinsing.

11. The process of claim 10, wherein drying is selected from contacting the substrate with heated nitrogen or applying to the substrate acetone or isopropyl alcohol.

12. A process for removing a substance from a substrate comprising,
   (a) coating the substance with a stripping composition to a thickness of 1000 microns or less, wherein said stripping composition comprises:
      i. at least one organic solvent at a weight percent ranging from 0.5% to 99.5%;
   (b) heating the substrate to a temperature above the flashpoint of the organic solvent for a time sufficient to release the substance; and
   (c) rinsing the substrate with a volume of a rinsing agent sufficient to remove the composition and the substance;
   wherein the process is a single stage process comprising (a) (b) and (c).

13. The process according to claim 12, wherein the substrate is heated to a temperature ranging from 100° C. to 200° C.

14. The process according to claim 12, wherein the substance to be removed is an organic substance.

15. The process according to claim 12, wherein the substance to be removed is a photoresist.

* * * * *